(12) United States Patent
Doutreloigne et al.

(10) Patent No.: US 6,917,236 B2
(45) Date of Patent: *Jul. 12, 2005

(54) METHOD AND APPARATUS FOR LEVEL SHIFTING

(75) Inventors: Jan Doutreloigne, Ghent (BE); Joachim Grupp, Enges (CH); Rolf Klappert, Neuchatel (CH)

(73) Assignees: Interuniversitair Micro-Elektronica Centrum (IMEC vzw), Leuvan (BE); Universitait Gent, Ghent (BE); Asulab S.A., Marin (CH)

( * ) Notice: Subject to any disclaimer, the term of this patent is extended or adjusted under 35 U.S.C. 154(b) by 0 days.

This patent is subject to a terminal disclaimer.

(21) Appl. No.: 10/797,512

(22) Filed: Mar. 10, 2004

(65) Prior Publication Data

US 2004/0169543 A1 Sep. 2, 2004

Related U.S. Application Data

(62) Division of application No. 09/668,681, filed on Sep. 22, 2000, now Pat. No. 6,731,151.
(60) Provisional application No. 60/159,624, filed on Oct. 14, 1999.

(30) Foreign Application Priority Data

Sep. 30, 1999 (EP) .............................................. 99870200

(51) Int. Cl.[7] .................................................. H03L 5/00
(52) U.S. Cl. ...................... 327/333; 327/112; 327/185; 327/225; 327/437; 326/68; 326/83
(58) Field of Search .................. 327/112, 185, 327/212, 225, 333, 437; 326/27, 63, 68, 80, 81, 83

(56) References Cited

U.S. PATENT DOCUMENTS

| | | | | |
|---|---|---|---|---|
| 4,731,553 A | * | 3/1988 | Van Lehn et al. | 326/27 |
| 4,855,623 A | * | 8/1989 | Flaherty | 326/87 |
| 5,332,932 A | * | 7/1994 | Runaldue | 326/33 |
| 5,410,267 A | * | 4/1995 | Haycock et al. | 326/81 |
| 5,412,331 A | * | 5/1995 | Jun et al. | 326/105 |
| 5,495,184 A | * | 2/1996 | Des Rosiers et al. | 326/73 |
| 5,633,832 A | * | 5/1997 | Patel et al. | 365/230.06 |
| 5,670,905 A | * | 9/1997 | Keeth et al. | 327/333 |
| 5,781,497 A | * | 7/1998 | Patel et al. | 365/230.06 |
| 5,838,515 A | * | 11/1998 | Mortazavi et al. | 360/78.12 |
| 5,903,179 A | * | 5/1999 | Kim | 327/309 |
| 5,914,908 A | * | 6/1999 | Pinkham et al. | 365/230.06 |
| 5,995,010 A | * | 11/1999 | Blake et al. | 340/653 |
| 6,137,140 A | * | 10/2000 | Efland et al. | 257/343 |
| 6,304,123 B1 | * | 10/2001 | Bosshart | 327/212 |
| 6,324,044 B1 | * | 11/2001 | Teggatz et al. | 361/119 |
| 6,342,996 B1 | * | 1/2002 | Drapkin et al. | 361/91.1 |
| 6,407,579 B1 | * | 6/2002 | Goswick | 326/81 |
| 6,433,583 B1 | * | 8/2002 | Micheloni et al. | 326/80 |

* cited by examiner

*Primary Examiner*—Terry D. Cunningham
(74) *Attorney, Agent, or Firm*—Rudolph J. Buchel, Jr.

(57) ABSTRACT

A level-shifter architecture with high-voltage driving capability and extremely low power consumption, exploiting dynamic control of the charge on the gate electrodes of the high-voltage output transistors, is provided. The architecture can be integrated in CMOS technology and can be applied to various applications, including monolithic integration of high-voltage display driver circuits in battery-powered applications.

2 Claims, 25 Drawing Sheets

(a) 5V NMOS (b) 5V PMOS (c) HV PMOS (d) HV NDMOS (e) HV PDMOS

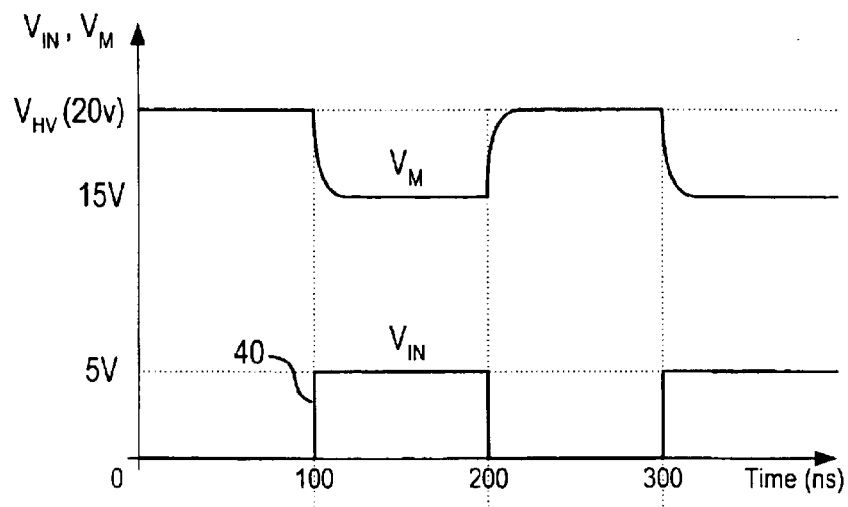
*FIG. 5A*
*FIG. 5B*
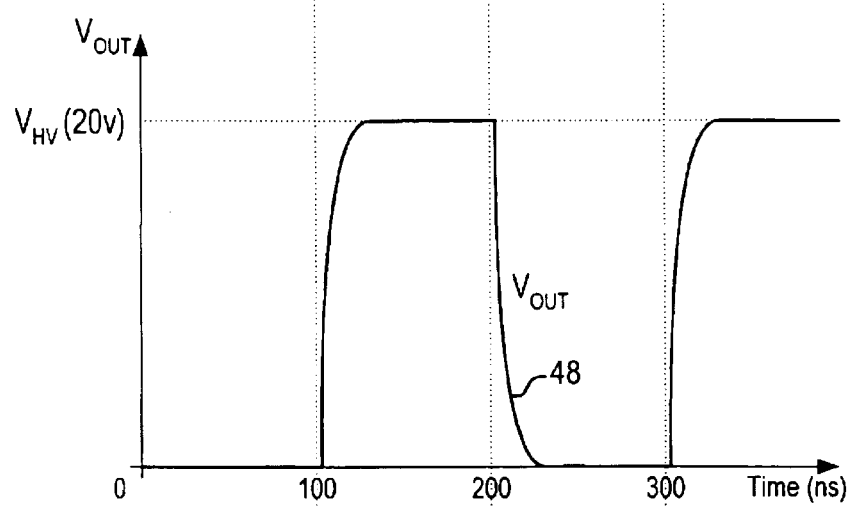
*FIG. 5C*
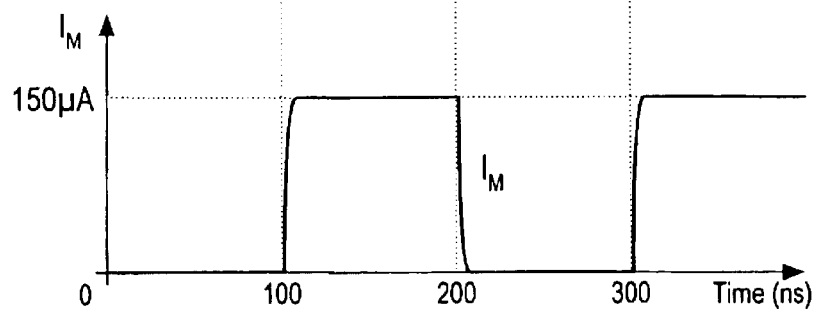
*FIG. 5D*
PRIOR ART

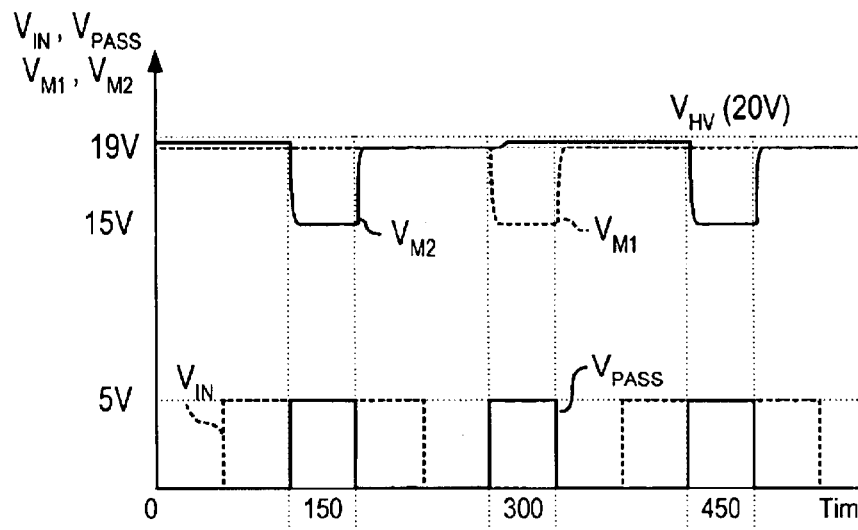
FIG. 10D
FIG. 10C
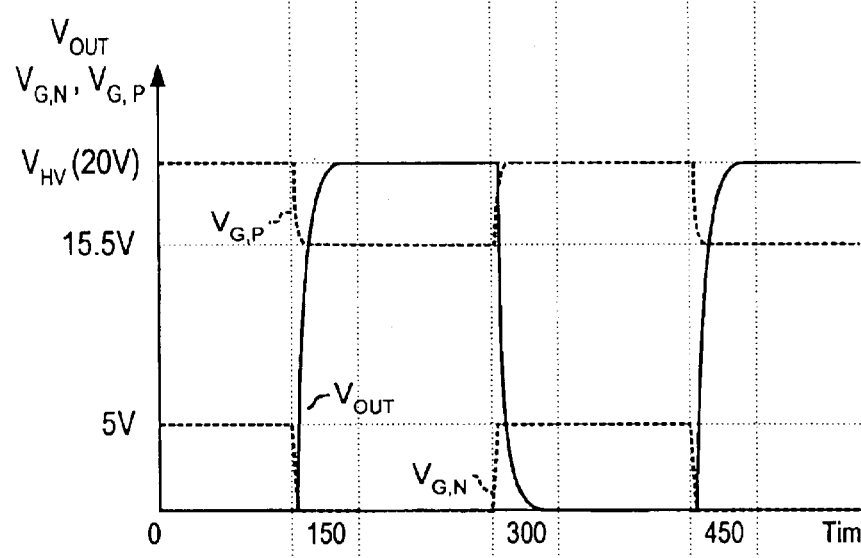
FIG. 10B
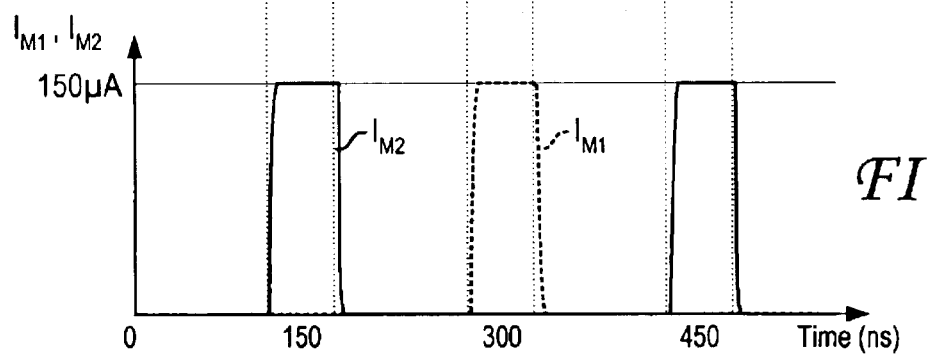
FIG. 10A

IMPROVED DYNAMICALLY CONTROLLED HIGH-VOLTAGE LEVEL-SHIFTER WITH EXTREMELY LOW POWER CONSUMPTION

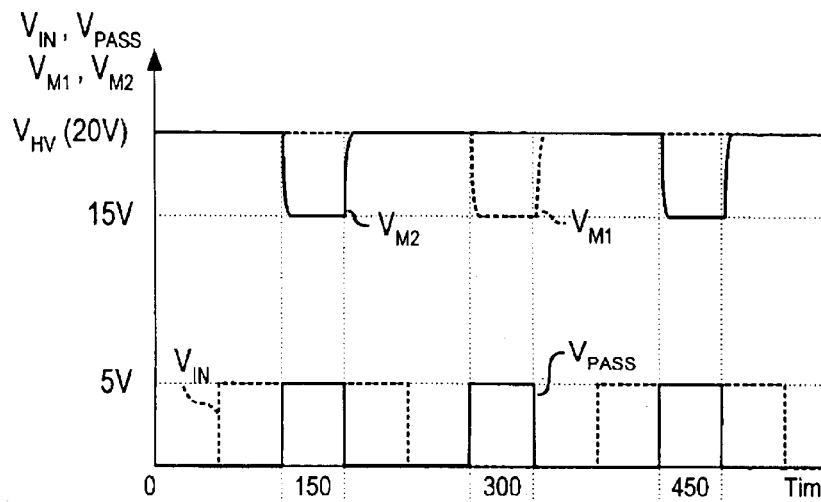
FIG. 13D
FIG. 13C
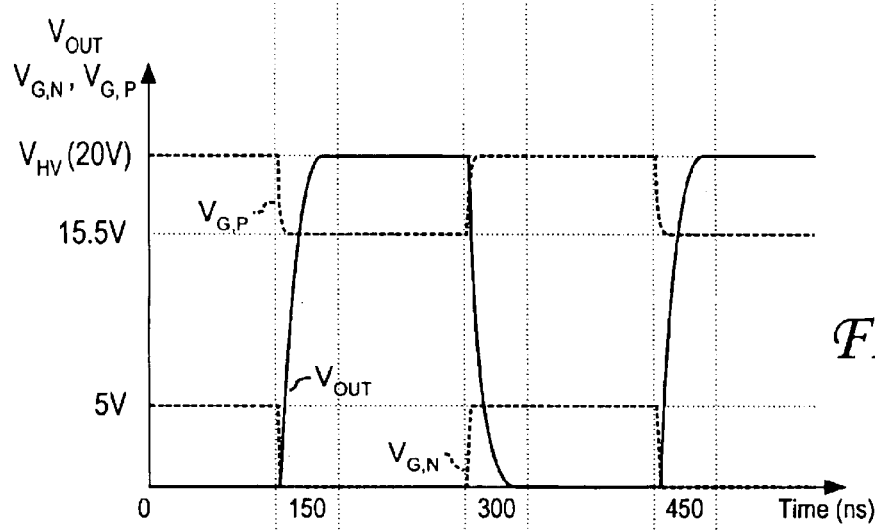
FIG. 13B
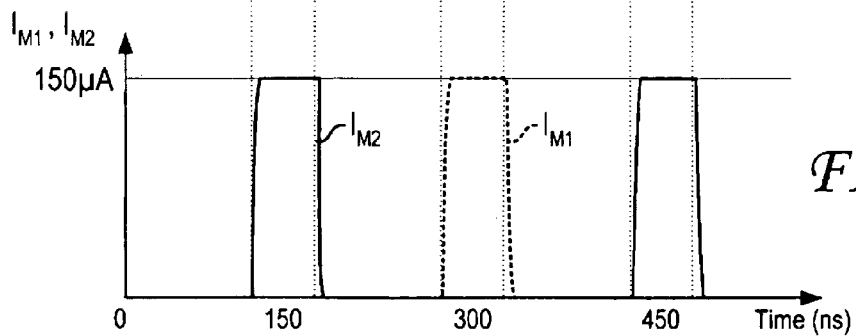
FIG. 13A

| FC | SP | SP |
|----|----|----|
| SP | FC | FC |
| FC | SP | FC |

*FIG. 22*

METHOD AND APPARATUS FOR LEVEL SHIFTING

CROSS-REFERENCES TO RELATED APPLICATIONS

This application is a divisional of U.S. patent application Ser. No. 09/668,681, filed Sep. 22, 2000 now U.S. Pat. No. 6,731,151, which claims priority from U.S. Provisional Application No. 60/159,624, filed Oct. 14, 1999 and European Application No. 99870200.5, filed Sep. 30, 1999, all of which are incorporated by reference their entities.

BACKGROUND OF THE INVENTION

1. Field of the Invention

The invention relates to methods and circuits for low power consuming high-voltage level shifting and related circuitry.

2. Description of Related Art Including Information Disclosed under 37 CFR 1.97 and 1.98

Many integrated circuits, such as display drivers, require a combination of high-voltage driving capability (an output voltage swing up to 100V or more) and a digital control using standard 5V CMOS logic. Hence, complex level-shifting circuits are needed to convert the 5V control signals into the desired high-voltage output waveforms. Moreover, in many of those applications, the system is battery-powered and very severe constraints are put on the power consumption of the level-shifters. An application where both high-voltage driving capability and extremely low power consumption are required is the design of driver chips for cholesteric texture LCDs as discussed by J. W. Doane, D. K. Yang and Z. Yaniv in their paper, "Front-lit Flat Panel Display From Polymer Stabilized Cholsteric Textures", in the proceedings of the 12$^{th}$ *International Display Research Conference* (Japan 92), p. 73. As discussed in the paper, quite high voltage levels (50V rms) are necessary to switch this kind of liquid crystal from one stable state to another. However, its inherent memory function (images remain unchanged on the screen without the need for continuous refreshing) is a major advantage compared to other types of liquid crystals, as it allows the implementation of certain display systems with very low image frame rates and a high degree of power efficiency. Consequently, these cholesteric texture LCDs are ideal components for use in battery-operated display systems with slowly or sporadically varying images. The cholesteric texture LCD's do, however, require the development of the generation of the required waveforms on the display rows and columns, and high-voltage driver circuits with very low power dissipation.

In most high-voltage CMOS technologies five different kinds of n- and p-type MOS transistors, such as shown in FIGS. 1A–1E, are used. The devices shown in FIG. 1(a) and FIG. 1(b) are standard non-floating NMOS and floating PMOS transistors for normal 5V operation (used in the CMOS control logic). The PMOS device shown in FIG. 1(c) can float up to a high voltage with respect to the substrate potential. However, in the PMOS device of FIG. 1(c) $V_{GS}$ (the voltage between the gate and the source) and $V_{DS}$ (the voltage between the drain and the source) are limited to 5V, and hence this transistor is ideally suited for controlling the gate electrode of the PDMOS transistor in the output stage. It also serves very well as an active load in a voltage mirror. The NDMOS and floating PDMOS MOSFETs shown in FIG. 1(d) and FIG. 1(e) respectively have to withstand a high voltage between their source and drain electrodes (such as the ones in the output stage or the switching transistors in the voltage mirrors).

One basic version of a high-voltage level-shifter is the well-known circuit shown in FIG. 2. This circuit exhibits a classic complementary output stage with independent control of the gate voltages of the NDMOS and PDMOS transistors 30 and 32 respectively. Standard 5V logic is used to control the NDMOS transistor 30, while a voltage mirror made up of transistors 34 and 36 is required to apply the appropriate gate signal to the PDMOS transistor 32. Unfortunately, the gate control of the PDMOS transistor 32 is not optimum, as is demonstrated by HSPICE-simulations represented by the graphs of FIG. 3. These HSPICE-simulations are based on transistor model parameters from a high-voltage extension of a 0.7 μm CMOS technology. When the input data line shown at 38 in FIG. 3(b) is switched from a logical "1" to "0", the $V_{GS}$ of transistors 36 and 32 is not entirely discharged to 0V but to a value of approximately –1V, being the threshold voltage of the PMOS transistor 36. Consequently, the PDMOS output transistor 32, having a slightly different threshold voltage, is not driven 100% into cut-off operation, resulting in an output voltage of 0.5V instead of the ideal 0V value as shown at 40 in FIG. 3(c). Moreover, the simultaneous conduction of both DMOS transistors 30 and 32 in the output stage represents a significant waste of energy.

The problem can be solved by discharging the $V_{GS}$ of the PDMOS output transistor 32 completely to 0V by means of a current mirror as illustrated in FIG. 4. It should be noted that common components of FIGS. 2 and 4 carry the same reference numbers. On the "1" to "0" transition of the input signal 40, the constant current source 42 providing a current $I_{BIAS}$ and the current mirror transistors 44 and 46 ensure that the $V_{GS}$ of transistors 32 and 34 is pulled down to 0V as shown at 48 in FIG. 5(c), resulting in a satisfactory logical "0" state at the driver output and avoiding the unnecessary power dissipation in the output DMOS transistors. FIG. 5 shows the HSPICE-simulation results on this circuit. An alternative approach to the circuit of FIG. 4 is the level-shifter proposed by M. Declercq and M. Schubert in their paper, "Circuit Intermédiaire Entre Un Circuit Logique à Basse Tension et un étage de Sortie à Haute Tension Réalisés Dans Une Technolgie CMOS Standard", also identified as patent 92 06030 at the *Institut National de la Propriété Industrielle*, Paris (France), where the current source 42 is no longer constant but controlled by the inverted input signal, resulting in a balanced circuit configuration. However, the level-shifter of FIG. 4 and all the variations described in the literature, have one major drawback: they show continuous power dissipation in the voltage mirrors for a logical "0" and/or a logical "1" at the data input. In the case of the simulation in FIG. 5(a) for instance, it can be seen that a stationary 150 μA current is flowing flowing through the drain termination of transistor 34 when a logical "1" bit is applied to the data input. This, of course, is unacceptable in battery-powered applications.

When considering cholesteric texture LCD drivers low-power high-voltage CMOS level-shifters cannot be used directly because they have a purely digital output (the output voltage is switched between 0V and $V_{HV}$ supply voltage), while the cholesteric texture LCDs need waveforms which are far more complicated. Some of the driving schemes require three-, four- or even five-level logic, and others need analog multiplexers to select complex analog waveforms. Hence, for all those applications, an analog switch, capable of withstanding high voltages and exhibiting the same extremely low power dissipation as high-voltage level-shifters, is needed. One classic circuit for a high-voltage analog switch is shown in FIG. 6. In this complementary analog switch, two diodes 50 and 52 have been included to avoid the unwanted conduction of the drain-bulk diodes in the DMOS transistors. To obtain the conducting "ON" state of the switch, the source-gate voltages of the DMOS devices should be $V_{GS,N}=V_{GS,P}=0V$ is needed. Although the circuit is widely used in all kinds of applications, it has some important drawbacks: since the gate potential of the PDMOS transistor 54 has to be 5V lower than the $V_{HV}$ analog signal on input 56 to put the switch in the conducting "ON" state and since the gate potential of the NDMOS transistor 58 should exceed the $V_{HV}$ signal with 5V under the same circumstances, the voltage range of the control circuit (responsible for applying the appropriate signals to the gates of the 2 DMOS transistors) should be at least 10V in excess of the total $V_{HV}$ range. For the control of the NDMOS transistor 58, a double voltage mirror is required. The first one shifts the 5V control input signals upwards towards an auxiliary supply voltage that is at least 5V higher than the highest $V_{HV}$ value, and then the second voltage mirror shifts these signals downwards to the $V_{HV}$ level. The choice of the transistor parameters in this double voltage mirror is extremely critical and very special care has to be taken to avoid excessive voltages on the gates of the transistors. Small deviations of the real transistor parameters from the values used in the simulations could result in transistor breakdown. This classic high-voltage analog switch uses a floating NDMOS device, meaning that its bulk can float up to a high voltage with respect to the substrate potential. Unfortunately, in many high-voltage CMOS technologies only non-floating NDMOS transistors (where the substrate acts as the transistor bulk) are available.

In summary it can be stated that no high-voltage level shifting circuit with low power consumption is known to be in the prior art. Indeed in state of the art level shifting circuitry, simultaneous conduction of the output stage transistors or of the circuitry controlling these output stage transistors is typical. This leads to continuous power dissipation. Also conventional analog switch concepts are not suited for high-voltage switching. Such an analog switch will need control circuitry, such as in the level-shifters, suited for high-voltage switching and with low power consumption, which are not available in the state of the art.

Therefore, it is an object of the invention to provide circuitry which can be used in high-voltage level shifting circuits and analog switches which have no continuous power dissipation and no simultaneous conduction of the output stage transistors. The use of such circuitry results in extremely low power consumption in high-voltage level shifters and analog switches. The circuitry enables implementation of dynamic control of the charge on the gate electrodes of the high-voltage output transistor.

SUMMARY OF THE INVENTION

In the invention an apparatus, circuit or method, provides an output voltage. The apparatus comprises an output circuit having a first and second part and at least one input circuit. The first and second parts of the output circuit are either electrically complementary or electrically equivalent. Each of the first and second parts of the output circuit include an input terminal. The apparatus dynamically controls at least one of the first and second parts of the output circuit. Dynamic controlling as used herein means that the input circuit sets at least one of the input terminals to a voltage level related to an externally inputted input voltage of the input circuit only when an inputted strobe voltage is set externally to a first predetermined voltage level. The input circuit stores the latest voltage level on the input terminal when the inputted strobe voltage is set to a second predetermined voltage level. Such storage is enabled by electrically isolating the input terminal from the rest of the circuitry.

In a first embodiment of the invention the apparatus is a high-voltage level shifting circuit with electrically complementary first and second parts in the output portion of the circuit. In this embodiment, it is not necessary to have more than one input circuit.

According to another embodiment of the invention, the apparatus includes an analog switch circuit with electrical equivalent first and second portions in the output circuit. In this type of circuit both the first and second parts are controlled by an input circuit.

According to yet another embodiment, the apparatus is a combination of a digital high-voltage level shifting circuit and an analog switch circuit. This arrangement is capable of generating multiple-level logic.

According to still another embodiment, the apparatus is an analog multiplexer with high-voltage driving capability and zero static power consumption. Using an analog multiplexer allows the use of an electrical connection (with very low resistance) between its output and a first analog input signal, or between its output and a second analog input signal, depending on the logical value of a 5V input control signal.

BRIEF DESCRIPTION OF THE DRAWINGS

These and other features of the present invention will be more fully disclosed when taken in conjunction with the following Detailed Description of the Invention in which like numerals represent like elements and in which:

FIGS. 5A through FIG. 5D show an HSPICE simulation of the FIG. 4 circuit;

FIGS. 10A through FIG. 10D show HSPICE simulation results for the circuit of FIG. 9;

FIG. 13 shows HSPICE simulation results for the circuit of FIG. 12;

FIG. 22 shows a display pattern used for simulation; and

DETAILED DESCRIPTION OF THE INVENTION

A level shifting circuit produces an output voltage having a first range from an input voltage having a second range. As will be appreciated by those skilled in the art, the first range of the output voltage of a high-voltage level shifting circuit is larger than the second range required by the input voltage. The input voltage may typically be between a first voltage level (e.g., a digital '1' or 5V) and a second voltage level (e.g., a digital "0" or 0V), the difference between the two voltage levels define the input voltage range. The output voltage on the other hand, may be between a third (e.g., 50V) and a fourth voltage level (e.g., 0V). The difference between these two voltage levels define the output voltage range. Since the input voltage can be denoted to be two-level in an ideal circumstance it is considered to be either the first or the second voltage level. Of course, in normal or typical circumstances, deviations from the levels occur. Whenever the deviations are within the acceptable margins for a particular use, the input voltage can still be two-level. Similar considerations occur for the output voltage where the third and fourth voltage levels define the possible levels of the output voltage.

Figure 7:
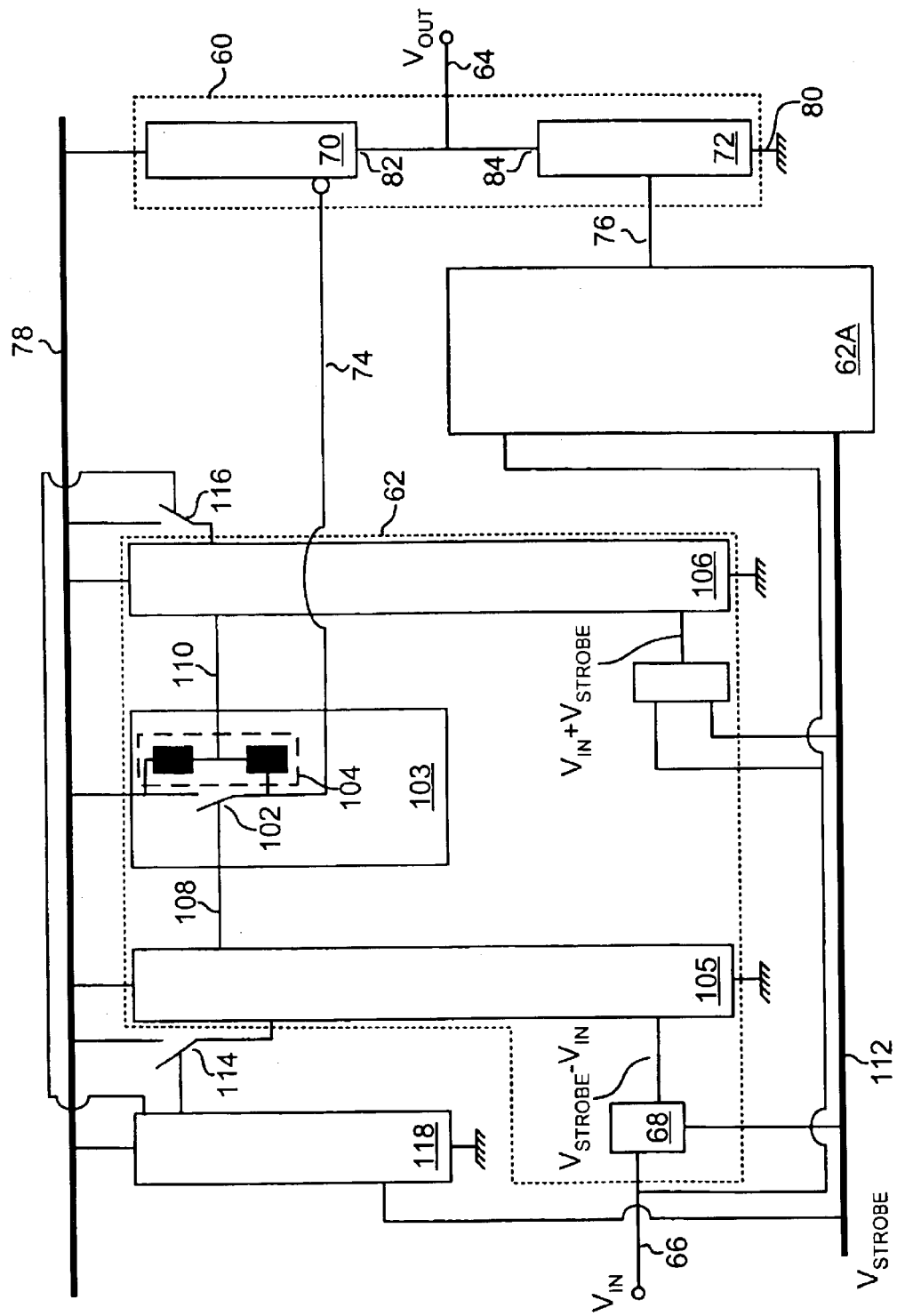
FIG. 7 shows a first embodiment of the present invention for level-shifting.

Referring now to FIG. 7 there is shown a general scheme of a level-shifting circuit having an output circuit 60 and an input stage or input circuit 62 can be distinguished. The output circuit generates the output voltage on line 64. The input circuit 62 controls the output circuit 60 and receives an input voltage on line 66. The input circuit 62 sets at least one of input terminals 68 to a voltage level $V_{STROBE}$ being related to an externally inputted input voltage of the input circuit. The relation is predetermined. The output circuit typically comprises a first part 70 and a second part 72. Both first part 70 and second part 72 have an input terminal connected to input circuitry thereby enabling the input circuit 62 and 62(A) to control the operation of the first part 70 and the second part 72. Besides the input terminals 74 and 76 both connecting to a voltage buss such as the "third" voltage level buss 78 and the "fourth" voltage level buss 80, each of the parts 70 and 72 are connected to one of the high-voltage level buss 78 or the low-voltage level buss 80. These voltage levels should be considered to be relative to each other, and that the two parts 70 and part 72 are electrically complementary. This means that the current through the first part 70 is determined by the voltage between its input terminal 74 and its connection 76, to a high-voltage level buss 78, and the current through the second part is determined by the voltage between its input terminal 76 and its connection to the low-voltage level buss 80.

In the embodiment of FIG. 7 which provides for level-shifting, first part 70 and second part 72 are connected in series. First part 70 is connected to the high level or third voltage level buss 78. Second part 72 is connected to the low level or fourth voltage level buss 80. In addition, both first part 70 and second part 72 have output connections 82 and 84 respectively which are connected together and define said output voltage 64 of the level-shifting circuit. The operation of this embodiment is based on the fact that the input circuitry 62 and 62(A) controls output circuit 60 such that either first part 70 or said second part 72 is active. The term active as used with respect to the two parts 70 and 72 means that one of the parts is conducting or current is following through it from its voltage connection to its output connection such that the output voltage 64 is either equal to the voltage on the third voltage level buss 78 or equal to the voltage on the fourth voltage level buss 80 within acceptable margins. The first part 70 may be chosen to be, but is not limited to, a NDMOS device. Consequently, the input terminals 74 and 76 can be defined to be gates. Even when parts 70 and 72 are designed to be more than a single transistor, the terms source or drain will still be used. The selection of the voltages on the input terminals 74 and 76, is such that simultaneous conduction of the first part 70 and the second part 72 is prevented.

Figure 8:
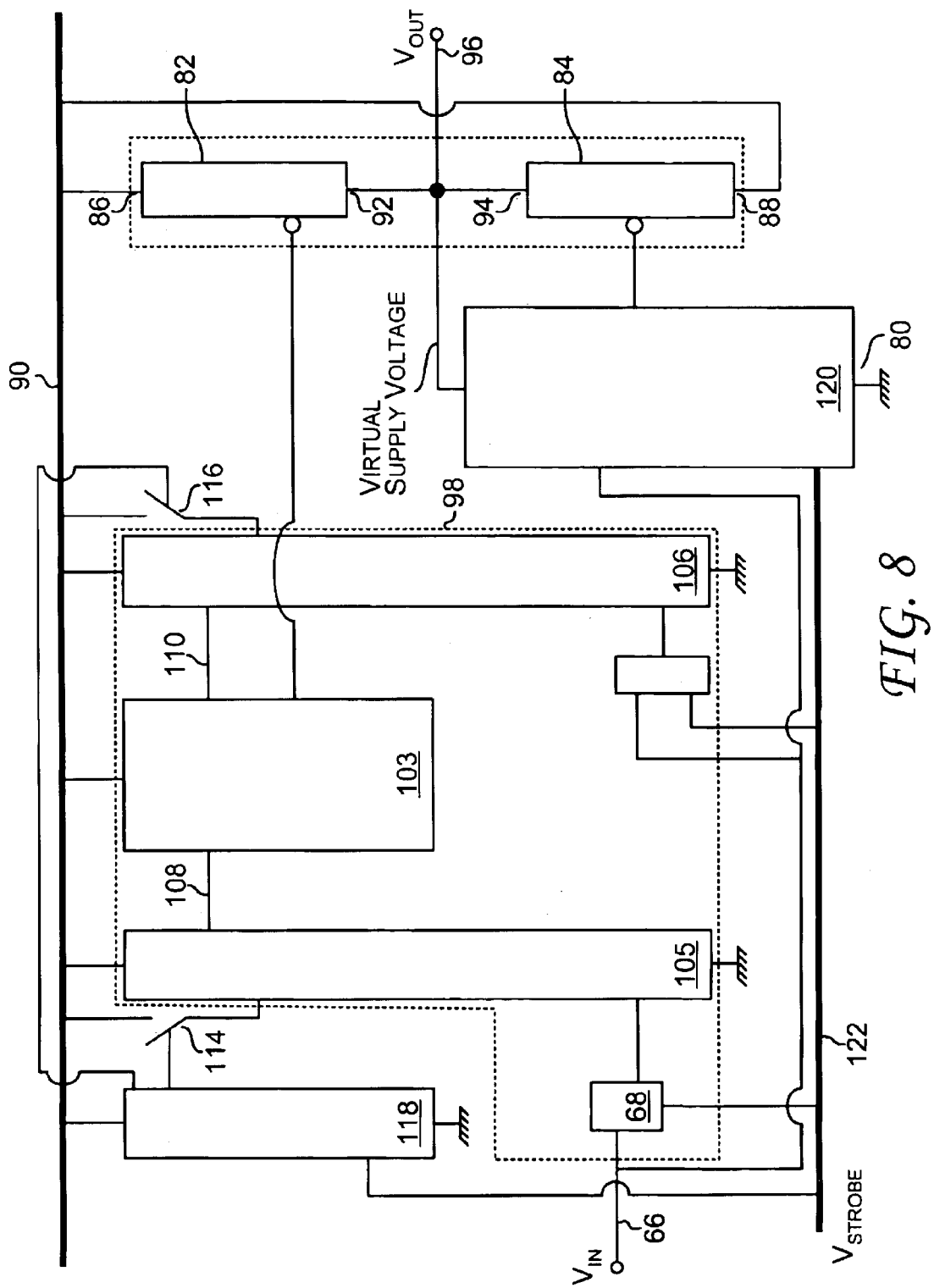
FIG. 8 shows a second embodiment according to the teachings of the present invention for analog switching.

According to a second embodiment shown in FIG. 8, the circuit is a slight variant of the first embodiment and is suited for analog switching. As was the case with the circuitry of FIG. 7, both first and second parts 82 and 84 are placed in series. Further, both first part 82 and second part 84 are connected at terminals 86 and 88 respectively to the third voltage level 90. The two output terminals 92 and 94 respectively of parts 82 and 84 are connected together and define the output voltage 96 of the analog switching circuit. The operation of this embodiment is based on the fact that the input circuit 98 controls output circuit 100 such that both first part 82 and second part 84 are active or non-active simultaneously. Both first part 82 and second part 84 may be selected to be, but are not limited to, a floating PDMOS device in series with a diode. The diodes and PDMOS devices are, however. oriented differently in first part 82 and second part 84. A connection in between the diode and the PDMOS device of at least one of the first and second parts is connected to input circuit 98 thereby realizing a virtual supply voltage.

The operation of the analog switch embodiment is discussed in greater detail below.

The level-shifting embodiment of FIG. 7 is discussed first. Since low power consumption is a primary object, simultaneous conduction of the first part 70 and second part 72 must be prevented. This can be realized when input circuit 62 controls at least one of the two parts. Consequently, input circuit 62 must be adapted to determine or set a voltage on input terminal 74. The voltage to be set on the input terminal depends upon a predetermined relationship with the external voltage. The circuitry 62A simply receives a $V_{strobe}$ signal and the Vin signal and provides an output of the appropriate time.

As discussed in the background of the invention, several prior art input circuits have been used, but they have as a drawback that they either do not provide appropriate control, or they themselves continuously consume power. This is not acceptable for battery-powered applications.

According to the invention therefore, a dynamic control principle is used. This means that the input terminal of the part being controlled, is dependent on an additional signal, denoted the "strobe" signal or "strobe" voltage. The "strobe" voltage is also provided to the input circuit. The strobe voltage is also two-level, preferably using the same voltage levels of the input voltage. Therefore, when the strobe voltage is at a first strobe voltage level, the input circuit is active and sets the input terminal of the part being controlled such that the appropriate voltage level is obtained at the output of the level-shifting circuit. It is seen that the voltage level on the input terminal of the part of output circuit 60 being controlled is related to the input voltage. When the strobe voltage is at a second strobe voltage level, the input circuit is non-active and thus not consuming power. Moreover when the strobe voltage is at the second strobe voltage level, the input terminal of the part being controlled should hold or store the latest value. Therefore, the input circuit must be designed such that when the strobe voltage is at the second strobe voltage level, the input terminal of the part being controlled is electrically isolated. Its latest value is then stored by the capacitance seen by the input terminal. With reference to the analog switching embodiment of FIG. 8, it is clear that the same dynamic control principle is applied to both the first and said second parts of the analog switch output stage.

The first part 82 and the second part 84 of output circuit 100 only conducts sufficiently when the generalized gate-source voltage in absolute value exceeds a certain threshold value by a selected amount. The selected amount depends on the configuration of the first and second parts. Further, the first and said second parts of output circuit 100 are only sufficiently non-conducting when the generalized gate-source voltage in absolute value is sufficiently below a selected threshold value, which also depends on the configuration of part 82 and part 84. Preferably the gate-source voltage is zero. Therefore, the input circuit should provide the appropriate voltage level to the input terminal of the part being controlled, thus resulting either in a gate-source voltage sufficiently close to zero when the part is expected to be non-active, or resulting in a gate-source voltage sufficiently exceeding the threshold voltage.

As can be seen in FIG. 8, the dynamic control principle is applied to the first part 82 of output circuit 100 since part 82 is connected to the third voltage level buss 90. The same approach, however, can be used when the dynamic control principle is applied only to the second part or to both parts.

As shown in FIG. 7, one approach is that for a zero gate to source voltage, the input terminal 74 is electrically connected with the third voltage level buss 78 via a first switch 102 and that for a non-zero gate to source voltage, a voltage drop over a transistor or other electronic device with respect to the third voltage level buss 78 is realized. This voltage drop being sufficient such that the non-zero gate to source voltage exceeds in absolute value the threshold value to activate the first part 70. The voltage on input terminal 74 of said first part 70 is denoted by a fifth voltage level. The first switch 102 of switching circuit 103 can be, for instance, an ordinary PMOS transistor. An electronic device 104 of switching circuit 103 for realizing a voltage drop can also be an ordinary PMOS transistor with its gate connected to its drain. It is clear that the first switch 102 must be controlled by some circuitry such as, for example, a first subcircuit 105. Also the electronic device 104 for realizing the voltage drop must be controlled by still another circuitry such as, for example, subcircuit 106, to pull sufficient current through the electronic device 104.

As indicated above, first switch 102 and electronic device 104 can be considered to be part of switching circuit 103, with two inputs, the first input 108 being the control of first switch 102 and the second input 110 being the drain of electronic transistor device 104. The output 112 of switching circuit 103 is, therefore, the input terminal 74 of first part 70 of the output circuit 60. As discussed above, circuitry for controlling the two inputs 108 and 110 of switching circuit 103 is needed. Therefore, input circuit 62 also comprises first and second subcircuits 105 and 106. A different operation is necessary depending on the input voltage and the purpose of the circuitry. The operation is also dependent on the "strobe" voltage discussed above. The first subcircuit 105 is active when the input voltage 66 is set to the second voltage level and the "strobe" signal on buss 112 is set to the first voltage level. The first subcircuit 105 is non-active for other combinations. The second subcircuit 106 is active when both input voltage 66 and strobe voltage on buss 112 set at said first voltage level and is non-active otherwise. As the first subcircuit 105 is connected to first switch 102, it is activated by closing first switch 102 and thus providing a selected voltage for the transistor configuration in first switch 102. The second subcircuit 106 is connected to the drain of electronic device 104, and is active when current is pulled through electronic device 104. Both subcircuits 105 and 106 can have a similar configuration, for instance a series connection of a PMOS and NDMOS transistor. The difference is the input supplied to the subcircuits. A logical AND operation between a logically inverted input voltage and the strobe voltage is provided for the first circuit and a logical AND operation between the input voltage and the strobe voltage for the second circuit. Other subcircuit configurations are also satisfactory. One feature of the configuration of switching circuit 103 and the interconnection with the subcircuits is that when the strobe voltage on buss 112 is set to a second voltage level the input terminal of the appropriate first part 70 or second part 72 is electrically isolated.

Additional circuitry can be provided to prevent a slow discharge of the capacitance of the input terminal which maintains the last voltage value by means of first switch 102. This can be realized by connecting the control terminal 108 of first switch 102 to the third voltage level provided by buss 78 with a second switch 114. Also, the voltage drop over the electronic device 104 is preferably set to zero by using a third switch 116. Second switch 114 and third switch 116 can be PMOS transistors which are controlled by a circuit 118. Circuit 118 closes second switch 114 and third switch 116 when the input terminal 108 is to be electrically isolated from the input circuit 62.

As described above, the circuitry can include other configurations such as, for example, an analog switch. Indeed when both first part 70 and second part 72 of output circuit 60 are designed to be electrically equivalent instead of complementary, the result is an analog switch. In such an analog switch arrangement, third voltage level from buss 78 may be considered as a first side of the analog switch and the output voltage as the other side of the analog switch. The input voltage is then used for switching the analog switch on or off. As it is necessary to switch both first part 70 and second part 72 of output circuit 60 on or off simultaneously for obtaining the necessary switching behavior, the dynamic control principle can be used. Such an analog switch will therefore comprise a first input circuit 98 and a second input circuit 120 as shown in FIG. 8. Each of the two input circuits 98 and 120 are then connected one each to an input terminal of one of the two parts of output circuit 100. The input circuits must, of course, be adapted such that they set the input terminal to which they are connected to a voltage level related to the input voltage of its respective input circuits. When the strobe voltage on buss 122 is equal to a first selected voltage level, the input terminals are set to a voltage related to the input voltages of the input circuits. Likewise, when the strobe voltage is equal to a second voltage level, the input terminals are electrically isolated from the rest of the circuit such that they store the latest applied voltage by the capacitances seen at the input terminals. When the input voltage of the input circuits are set to the first voltage level, then the input terminal voltages are set to a voltage level which activates both parts of the output circuit 100 such that both parts are conducting. The analog switch apparatus, is therefore in a conducting mode. When the input voltage of the input circuits are set to the second voltage level, then the input terminal voltages are set to a voltage level which deactivates both parts of output circuit 100, such that both parts are in a non-conducting mode. The apparatus, is also therefore in a non-conducting mode. Functionally, the output voltage of the apparatus or analog switch is substantially equal to the third voltage level on buss 90 when the switch is in a conducting mode, and is electrically isolated from the third voltage buss 90 when the switch is in a non-conducting mode. It should be understood that each of the two parts of output circuit 100 must at least be connected at one side to the third voltage level buss 90. According to one embodiment, the first and second parts of the output circuit 100 comprise a floating PDMOS in series with a diode. The diode and PDMOS devices can however be oriented differently in each of the two parts. Each of the input circuits are connected to two voltage levels. A first input circuit can for instance be connected between the third voltage and a fourth voltage level, and the second input circuit is connected between the fourth voltage level and the side of the output circuit 100 controlled by input circuits 98 and 120. They are not connected to the third voltage level, and thereby defining a sort of virtual supply voltage for the second input circuit.

More specific embodiments of the invention are described in the following discussion.

Figure 9:
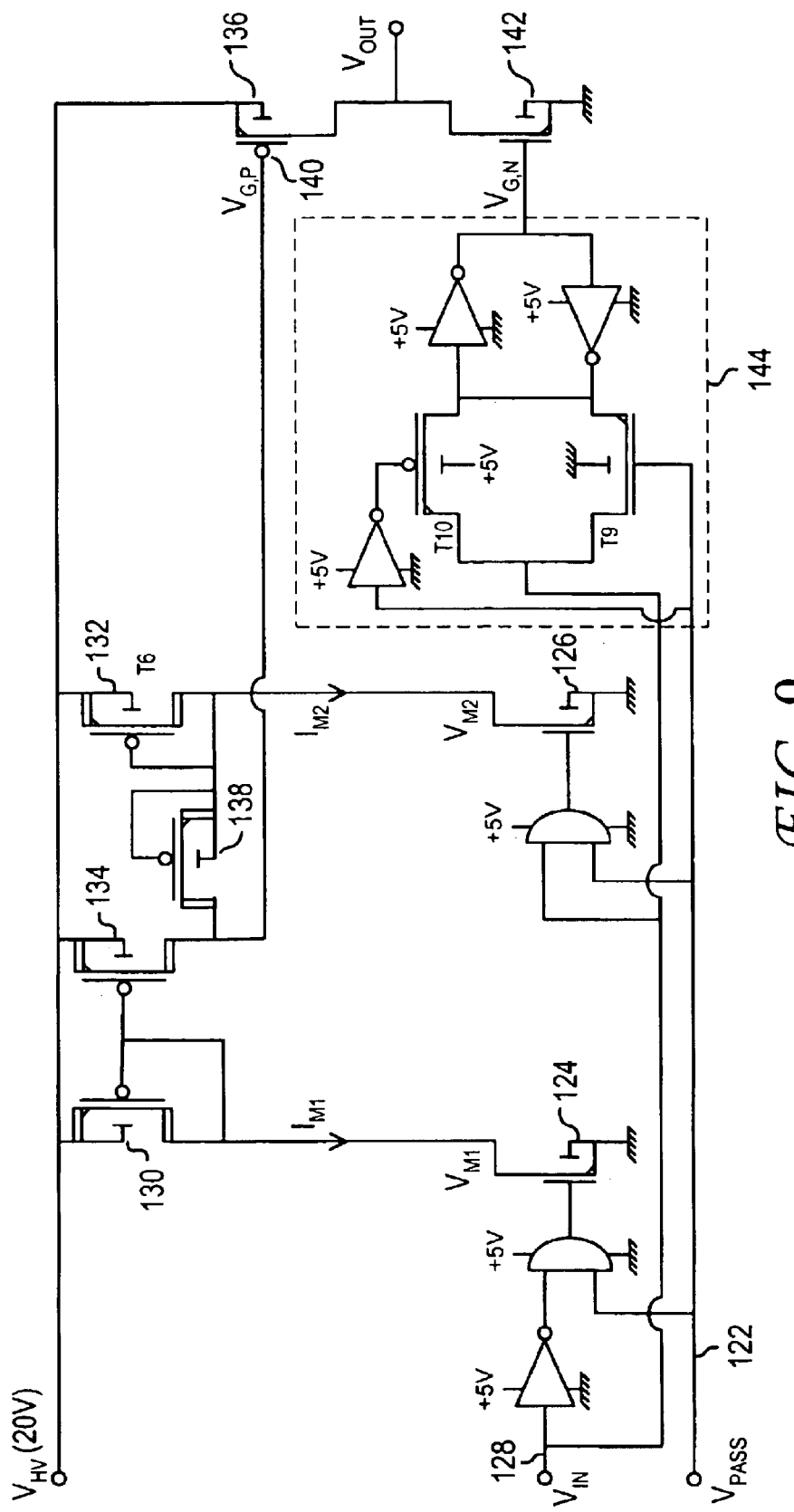
FIG. 9 shows a circuit including level-shifting according to the first embodiment of the present invention of FIG. 7.
Figure 11:
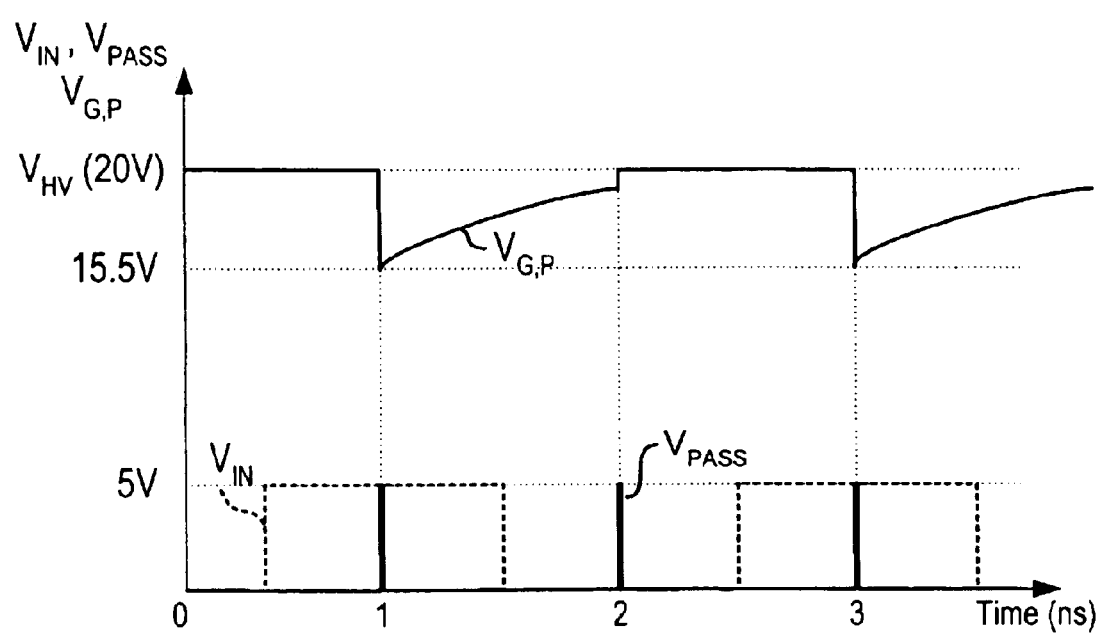
FIG. 11 shows HSPICE simulation charge leaking results for the circuit of FIG. 9.
Figure 14:
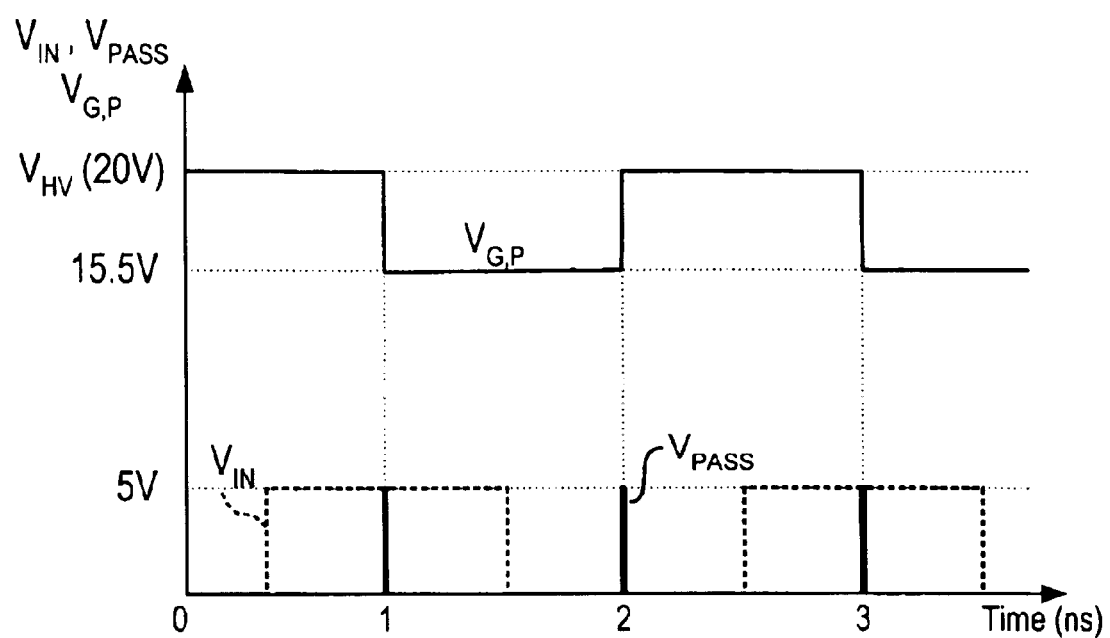
FIG. 14 shows HSPICE simulation charge storage results for the circuit of FIG. 12.

A first embodiment includes a PDMOS output transistor as the first part of the output circuit. In order to reduce the power consumption to an absolute minimum, dynamic control of the charge on the gate capacitance of the PDMOS output transistor is required. A circuit diagram of this embodiment and the corresponding HSPICE-simulations are shown in FIGS. 9, 10 and 11. It is seen that the operation of the level-shifter is controlled by a strobe voltage or signal $V_{PASS}$ on line 122. When this strobe signal goes high (designated as the first voltage level), one of the two transistors 124 or 126 (depending on the logical value of the input signal $V_{IN}$ on line 128 and illustrated graphically in FIG. 10(C)) will carry a 150 µA drain current as shown in FIG. 10(A), causing a voltage drop of 5V over the p-type load transistor 130 or 132. For a "0" bit (second voltage level) at the data input, the 5V drop across 130 turns on transistor 134, and consequently the voltage maintained by the source to gate capacitance of the PDMOS transistor 136 is totally discharged. Transistor 134 acts as a switch connecting the input terminal of PDMOS transistor 136 to the third voltage level ($V_{HV}$) as shown in FIG. 10(B). On the other hand, for a "1" bit (first voltage level) at the data input 128, the 5V drop across transistor 132 will pull down the gate potential of transistor 136 through transistor 138 (transistor 138 is used as a simple pn-diode), yielding a source to gate voltage of approximately −4.5V for output transistor 136. When the strobe signal goes low, the transistors 124 and 126 are switched off, and the voltage drop across transistors 130 and 132 is reduced to about 1V as shown in FIG. 10(D). As a consequence, transistor 134 will be turned off (if the input bit was a logical "0" during the strobe pulse) or the "diode" (transistor 138) will be polarized inversely (if the input bit was "1"). In both cases, the gate electrode 140 of PDMOS output transistor 136 remains electrically isolated from the rest of the circuit (meaning that only high-impedance connections exist between the gate electrode and other components), and hence the charge that was previously stored on its gate capacitance during the strobe pulse (0V or 4.5V according to the input signal) will remain unchanged until the next strobe pulse is applied. This approach of using the gate capacitance of the PDMOS output transistor 136 as a storage capacitor and updating its charge at the rhythm of a strobe signal that is synchronized to the data flow, yields an enormous reduction in power dissipation if the duration of one strobe pulse can be kept very small compared to the duration of one bit of input data. (This is because power is consumed only during the strobe pulses.) This is certainly the case for the cholesteric texture LCD drivers with their very low image frame rates. For the gate control of the NDMOS output transistor 142 in FIG. 9, a static 5V sense-amplifier 144 is used since it doesn't consume DC power. It should be appreciated, however, that the dynamic charge control method could also be used. The simulation results shown in FIG. 11 indicate, that even this circuit still experiences a minor leakage in current. In between strobe pulses, the $V_{GS}$ of 134 is set to approximately −1V as shown in FIG. 10(D). This small voltage keeps the transistor 134 at the edge of cut-off operation. As a consequence, a small but not insignificant leakage current (actually a sub-threshold current) will flow through its source and drain terminals. This current will slowly discharge the voltage stored by the gate capacitance of the PDMOS output transistor 136 as illustrated in FIG. 14. If a "1" bit was sampled during the strobe pulse, and if the charge is not updated on time, the level-shifter will not operate properly.

Figure 12:
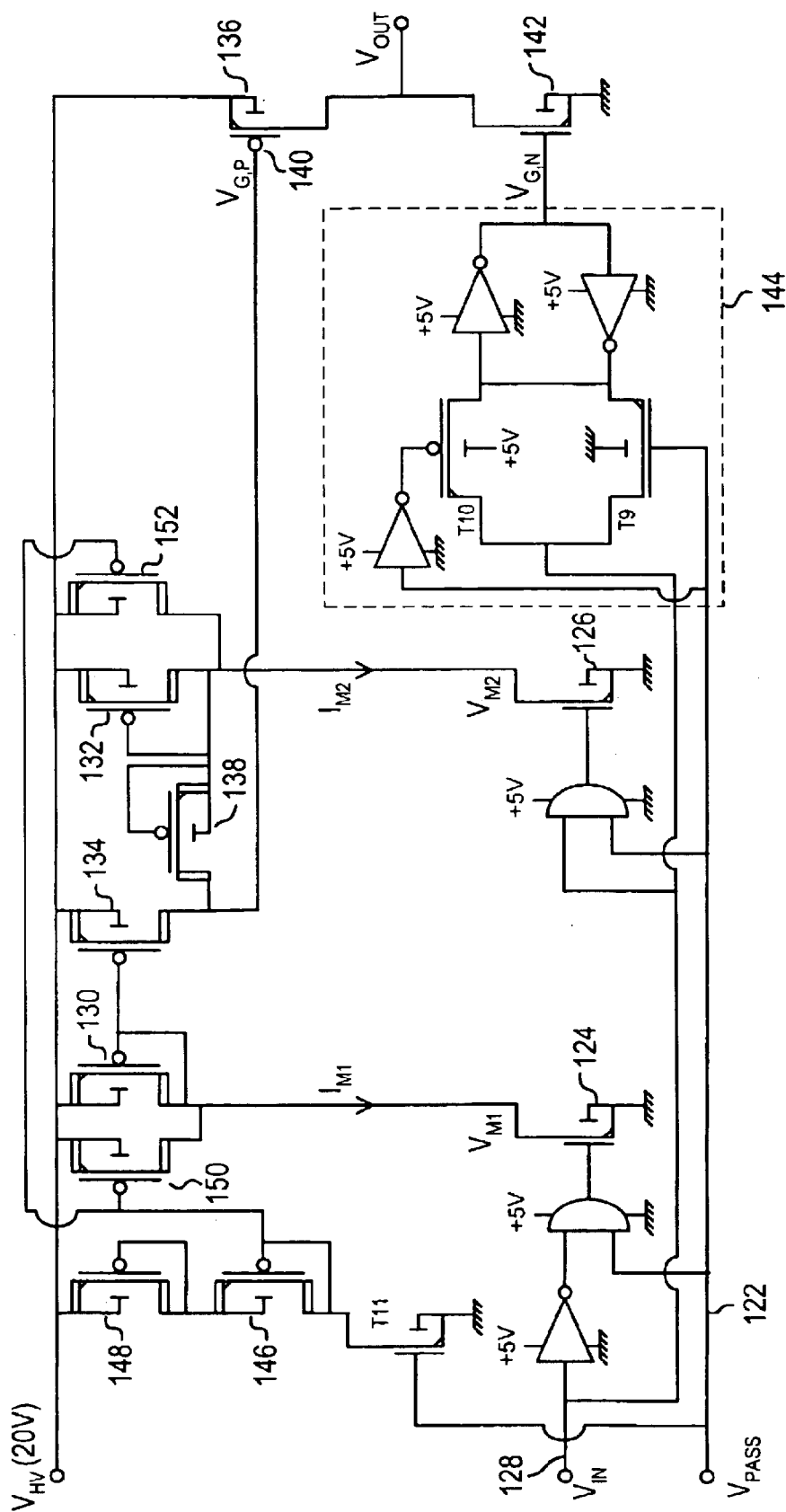
FIG. 12 shows an alternate embodiment of the circuit of FIG. 9, which prevents further discharging of gate capacitances.

In a second embodiment of the invention this problem is taken care of as shown in the circuit of FIG. 12 with the corresponding HSPICE-simulation results of FIGS. 13 and 14. On the high to low transition of the strobe signal, the $V_{GS}$ of each of the transistors 146 and 148 (which, assuming they were in the conducting state during the strobe pulse) is discharged to about −1V. Since transistors 146 and 148 are in series, the transistors 150 and 152 receive a $V_{GS}$ of approximately −2V, and hence the voltage drop across the active transistors 130 and 132 is completely discharged to 0V. Consequently, transistor 134 is driven far into its cut-off operating region with a negligible leakage current. In this way, the charge stored on the gate capacitance of the PDMOS output transistor 136 will not be affected between consecutive strobe pulses, as illustrated by the simulation results shown in FIG. 14. It has been found that reliable charge storage is obtained, even at extremely low strobe signal frequencies of only a few pulses per second.

Figure 1:
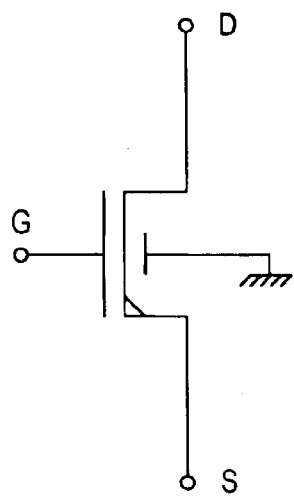
FIG. 1 illustrates examples of prior art CMOS devices suitable for use in the invented circuitry.
Figure 1:
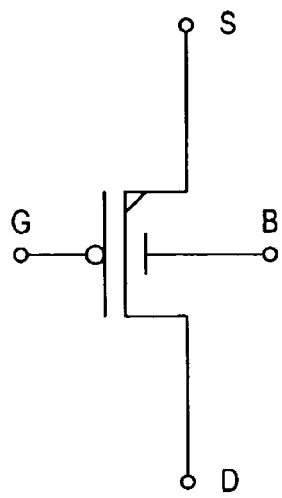
Figure 1:
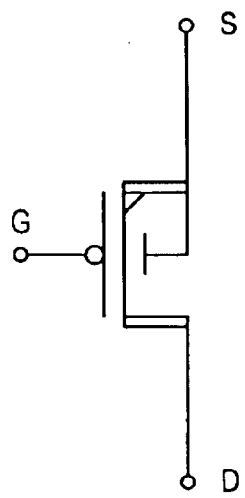
Figure 1:
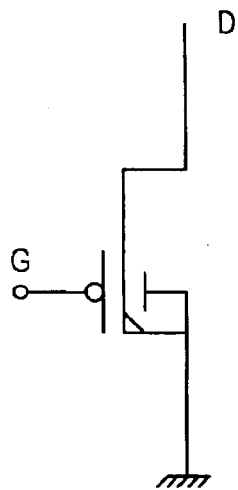
Figure 1:
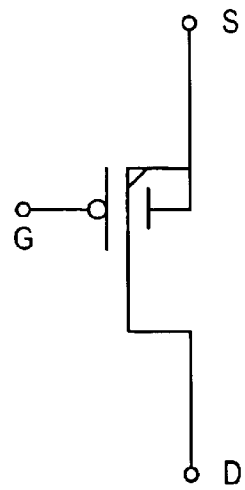
Figure 2:
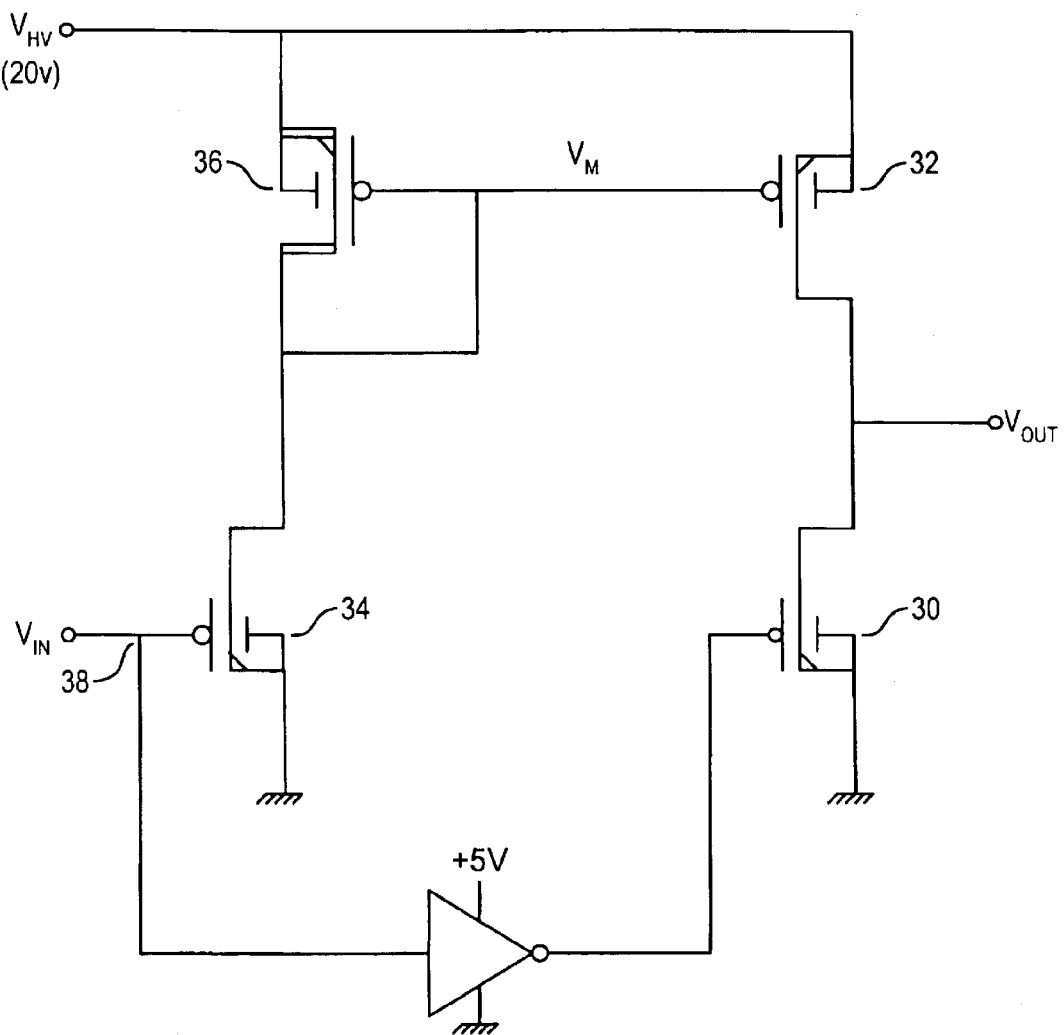
FIG. 2 shows a prior art high-voltage level-shifter.
Figures 3A, 3B, 3C:
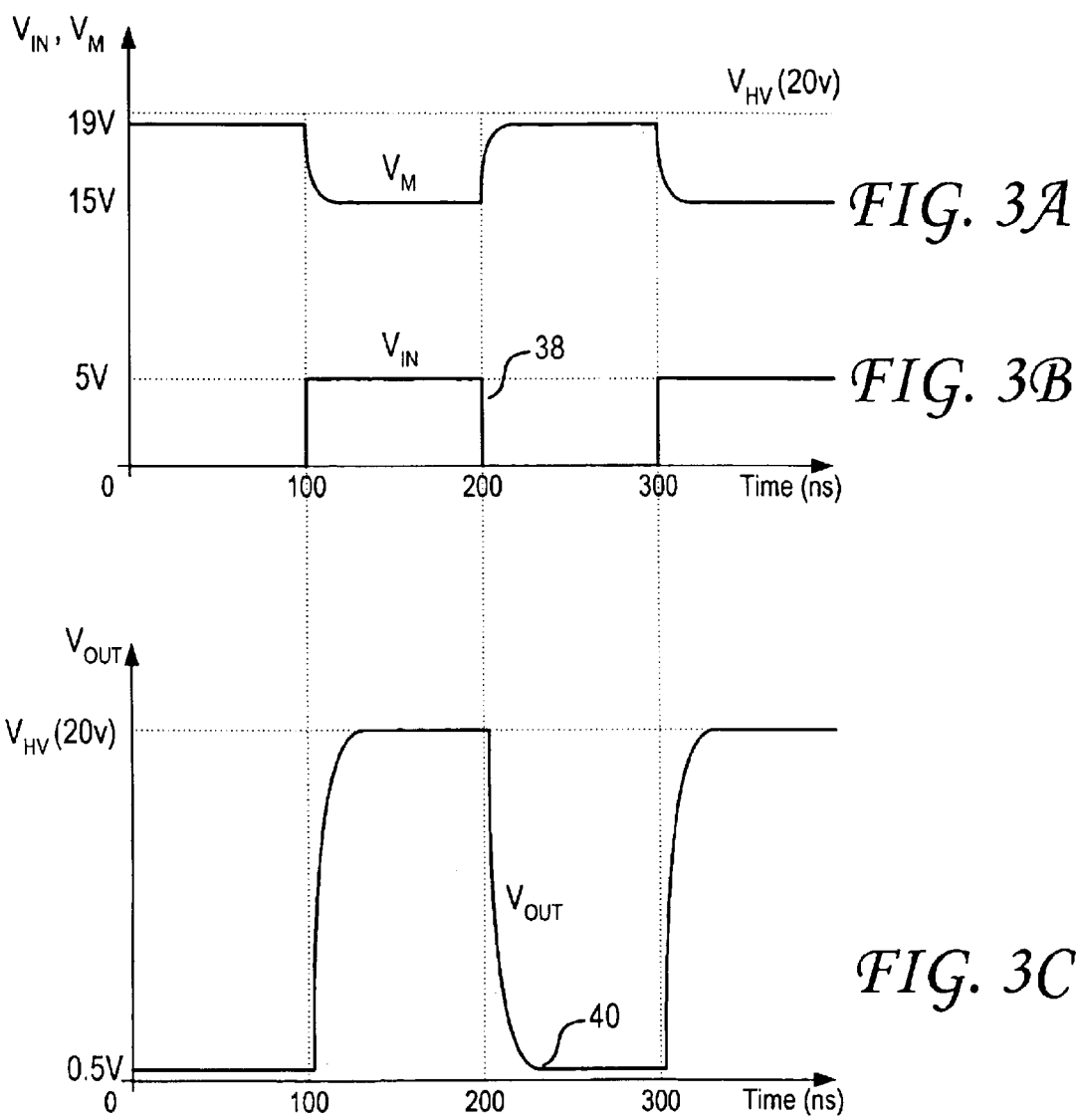
FIGS. 3A through FIG. 3C show an HSPICE simulation of the prior art high-voltage level-shifter operation of FIG. 2.
Figure 4:
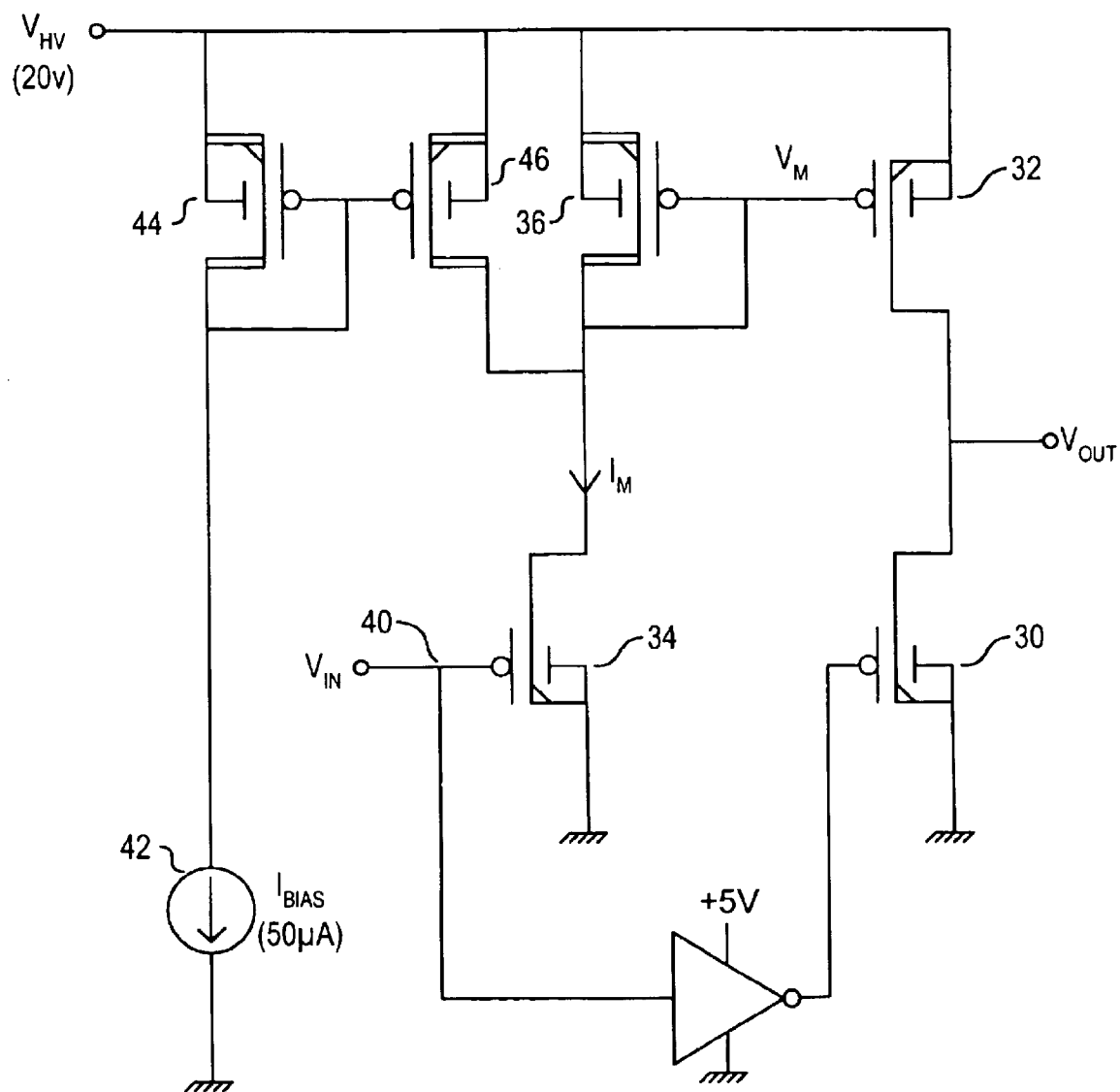
FIG. 4 shows another prior art high-voltage level-shifter.
Figure 6:
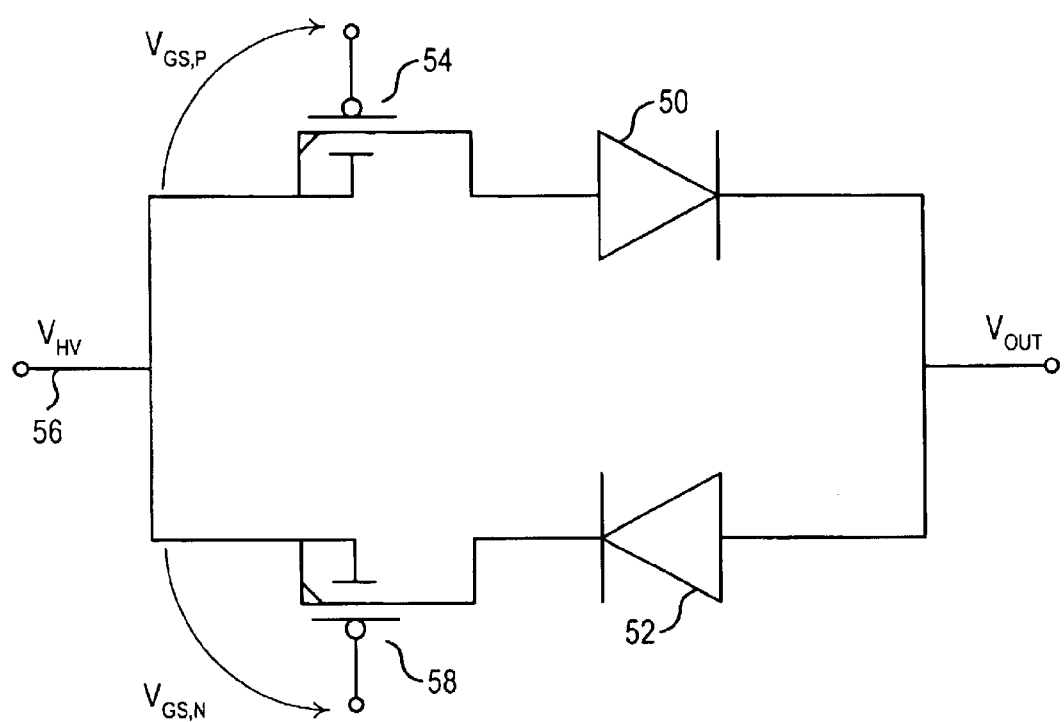
FIG. 6 illustrates a classical prior art analog switch circuit.
Figure 15:
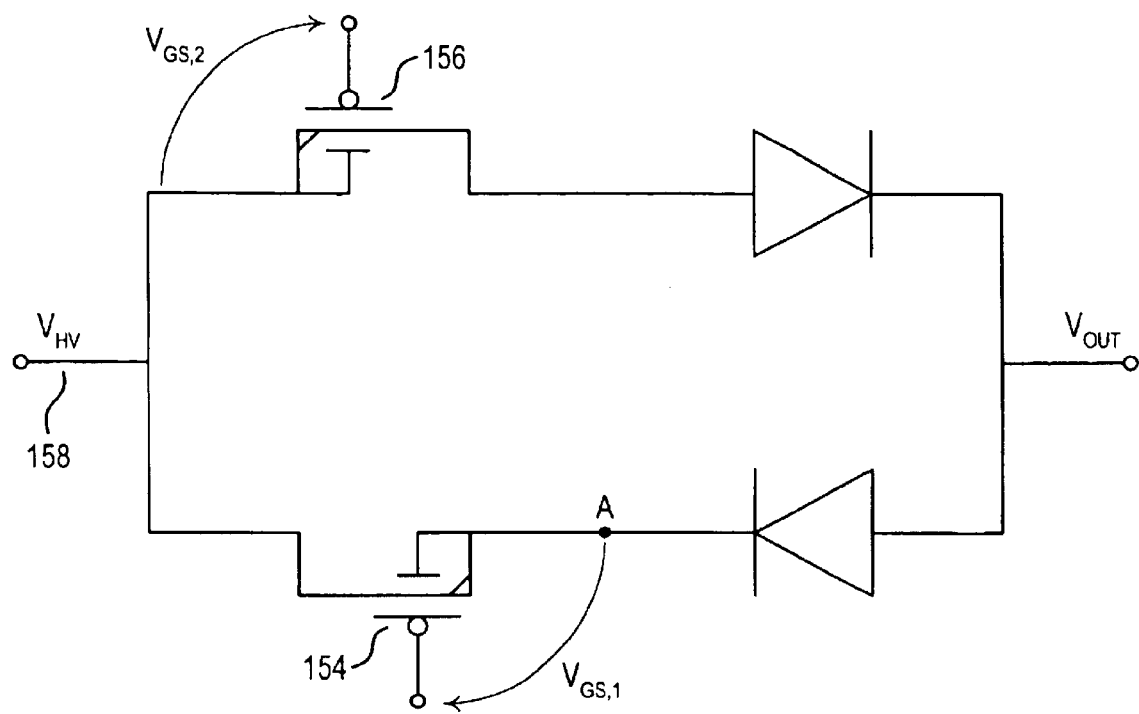
FIG. 15 shows an analog switch using two PMOS devices according to the teachings of the present invention.
Figure 16:
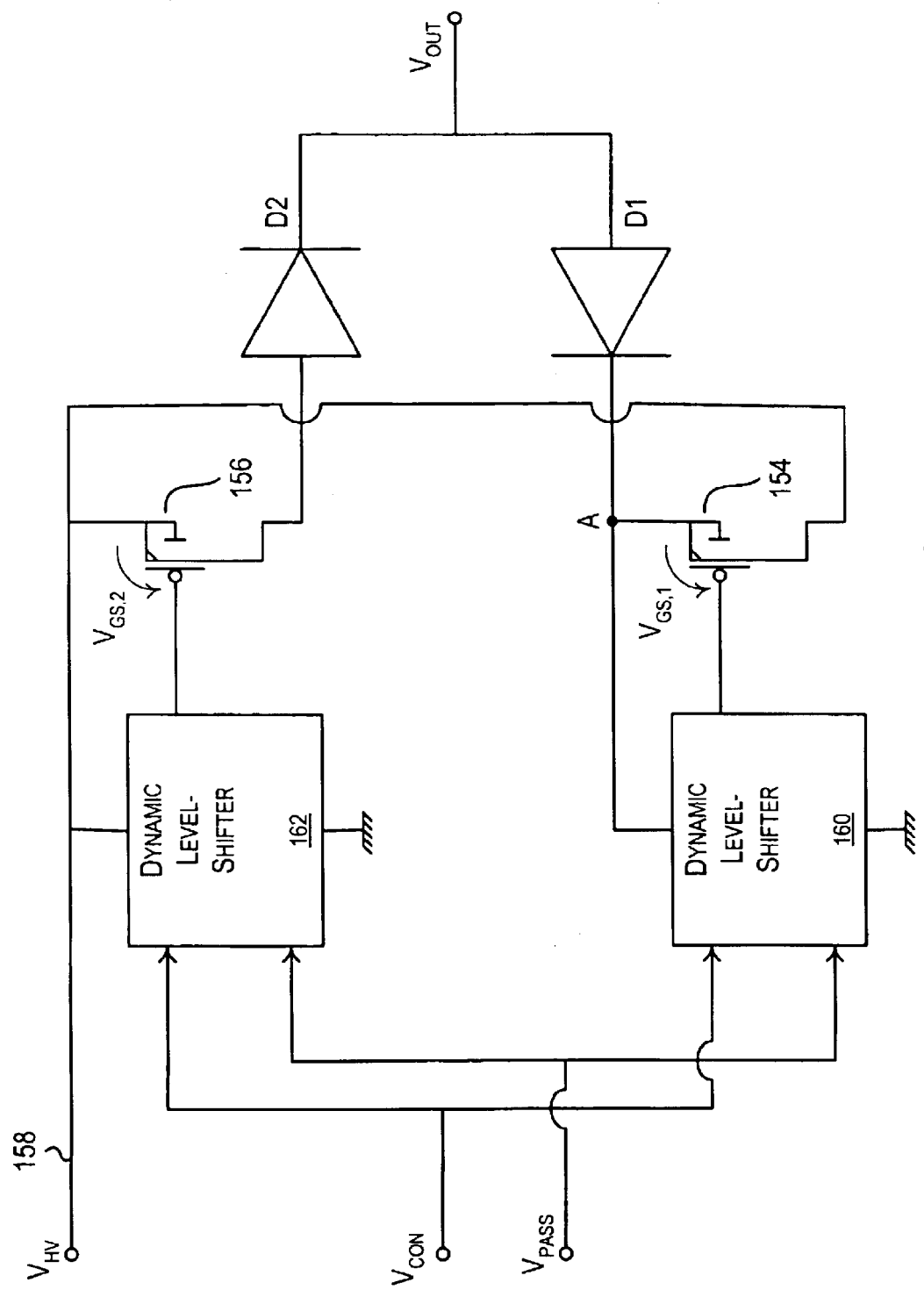
FIG. 16 shows the analog switch of FIG. 15 of this invention, with both inputs of the PMOS devices controlled by dynamic level-shifters, according to the second embodiment of the present invention.
Figure 17:
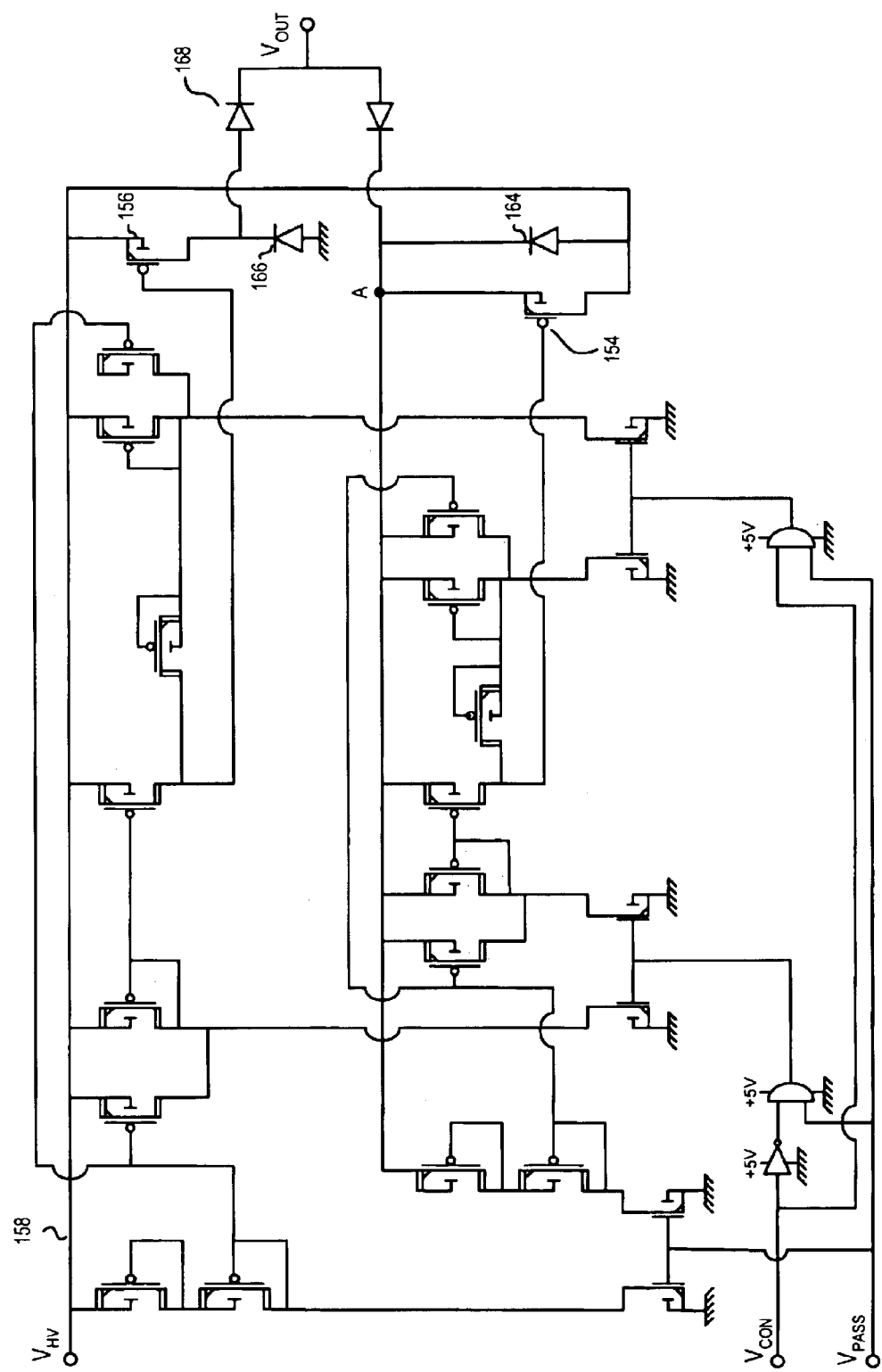
FIG. 17 shows a detailed circuit diagram of one embodiment of the circuit of FIG. 16.

In a third embodiment of the invention the dynamic control principle is used in the design of an analog switch suitable for use in Liquid Crystal Display drivers. A solution to the problems of the classic analog switch shown in FIG. 6 and discussed before is to replace the floating NDMOS transistor by a second floating PDMOS device, as shown in FIG. 15. To turn on the switch, a voltage value of $V_{GS,1} = V_{GS,2} = -5V$ is applied to the gates of the two PDMOS transistors 154 and 156, while the values $V_{GS,1} = V_{GS,2} = 0V$ turn the switch off. In this configuration, the gate potentials of the PDMOS transistors never exceed the $V_{HV}$ analog signal on line 158, and hence the voltage range of the circuit for the dynamic control of the two PDMOS transistors should be only 5V higher than the total $V_{HV}$-range. Since only PDMOS devices are used in this schematic, double voltage mirrors are no longer necessary and consequently a higher reliability is achieved. For the control of PDMOS transistor 156, the 5V switch control input signal is shifted towards the $V_{HV}$ level at the rhythm of a strobe pulse sequence. To control the gate of PDMOS transistor 154, the 5V input signal has to be shifted towards the potential of point A, which can, therefore, be considered as a kind of "virtual supply voltage" for the control circuit of transistor 154. This is shown in FIG. 16. For each of the dynamic level-shifters 160 and 162, the transistor configuration of FIG. 9 is used where the 5V CMOS control logic can of course be shared by the two level-shifters as both transistors 154 and 156 are always simultaneously in the "ON" or "OFF" state. FIG. 17 shows the complete architecture of the dynamically controlled high-voltage analog switch with zero static power dissipation. The diodes 164 and 166 were added to the circuit to achieve an almost ideal switching behavior. Diode 166 eliminates the negative voltage spikes which can be generated on the drain electrode of PDMOS transistor 156 by capacitive effects in transistor 156 and diode 168 under certain circumstances (for some very specific waveforms). Diode 164 reduces the effect of the non-negligible drain resistance of the PDMOS transistor 154 during the strobe-pulses.

In a fourth embodiment of the invention the analog switch of this invention can serve as a basic building block for even more complex high-voltage switches with substantially zero static power consumption. For instance, a combination of the high-voltage analog switch and a purely digital high-voltage level-shifter yields a high-voltage level-shifter with three-level logic at its output. By adding a second high-voltage analog switch, a four-level logic is obtained, etc. HSPICE-simulations on all these circuits show proper level-shifter operation.

Figure 18:
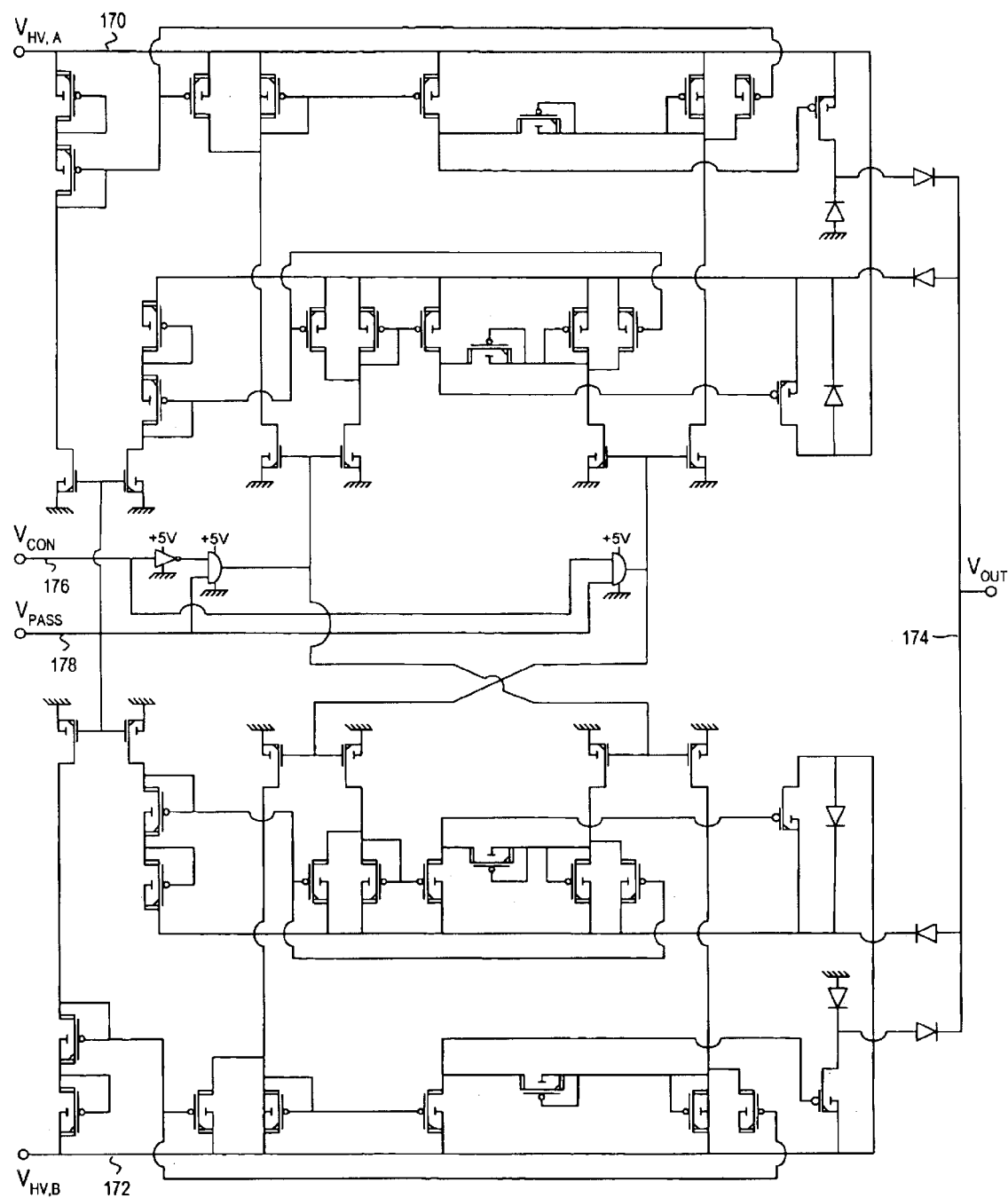
FIG. 18 shows an analog multiplexer circuit using circuitry according to the present invention.

According to a fifth embodiment a two-input analog multiplexer with high-voltage driving capability and zero static power consumption is provided. This analog multiplexer allows an electrical connection (with very low resistance) between its output and a first analog input signal, or between its output and the second analog input signal, depending on the logical value of a 5V input control signal. It will be appreciated that, such a multiplexer needs two analog switches (the first one between the output and the first analog input voltage, the second one between the output and the second analog input voltage), with complementary 5V control signals, since the second switch has to be in the "OFF"-state when the first one is conducting, and vice versa. Therefore, the same 5V CMOS control logic for both switches is used, but the connections to the voltage mirrors are interchanged. This can be seen in FIG. 18 which shows the dynamically controlled high-voltage two-input analog multiplexer.

Figure 19:
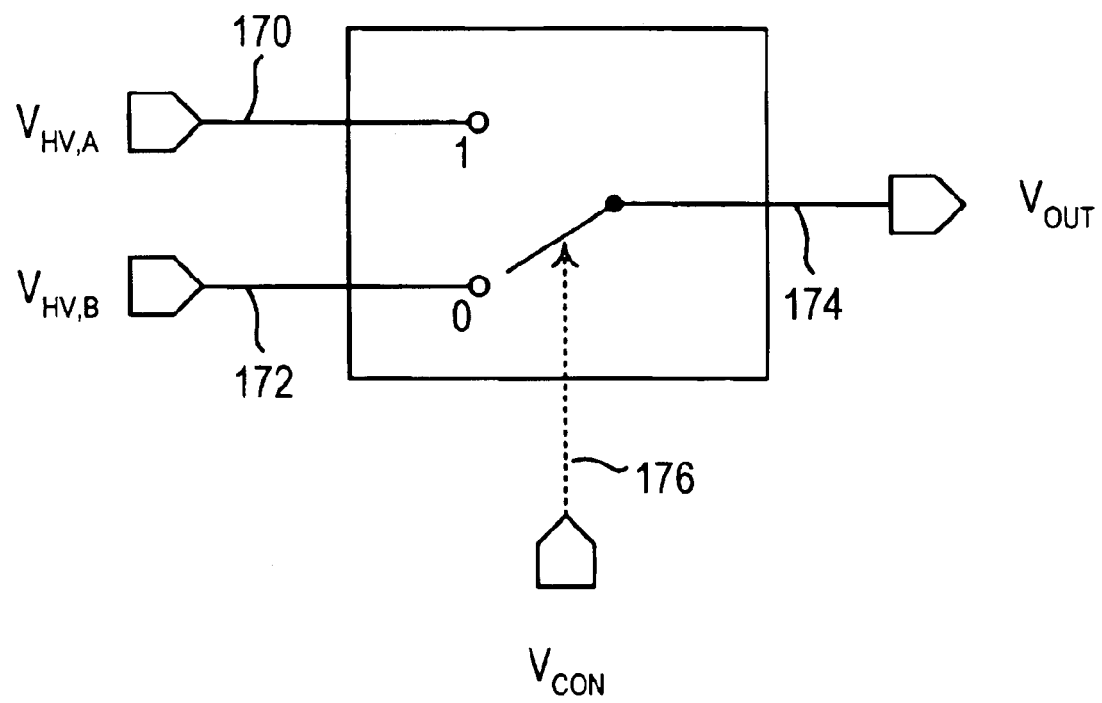
FIG. 19 is a simplified representation of the analog multiplexer of FIG. 18.

The practical use of this novel multiplexer circuit is simple and straightforward. $V_{HVA}$ on line 170 and $V_{HVB}$ on line 172 are the high-voltage input signals and $V_{OUT}$ on line 174 is the high-voltage output signal. $V_{CON}$ on line 176 is the 5V control input signal (which selects one of the two analog switches in the multiplexer) and $V_{PASS}$ on line 178 is the 5V strobe pulse sequence which samples the $V_{CON}$ input data. If $V_{CON}$="1" (5V) during a strobe pulse, an electrical low-resistance connection will be established between the output $V_{OUT}$ on line 174 and the input signal $V_{HVA}$ on line 170. On the other hand, if $V_{CON}$="0" (0V) during a strobe pulse, then the output $V_{OUT}$ will be connected to the input signal $V_{HVB}$. In between strobe pulses, the multiplexer state defined during the last strobe pulse, will be maintained until the next pulse. The operation of this dynamically controlled analog multiplexer (with the exception of the strobe pulse sequence) is represented in a simplified manner by the simple block diagram of FIG. 19.

Figure 20:
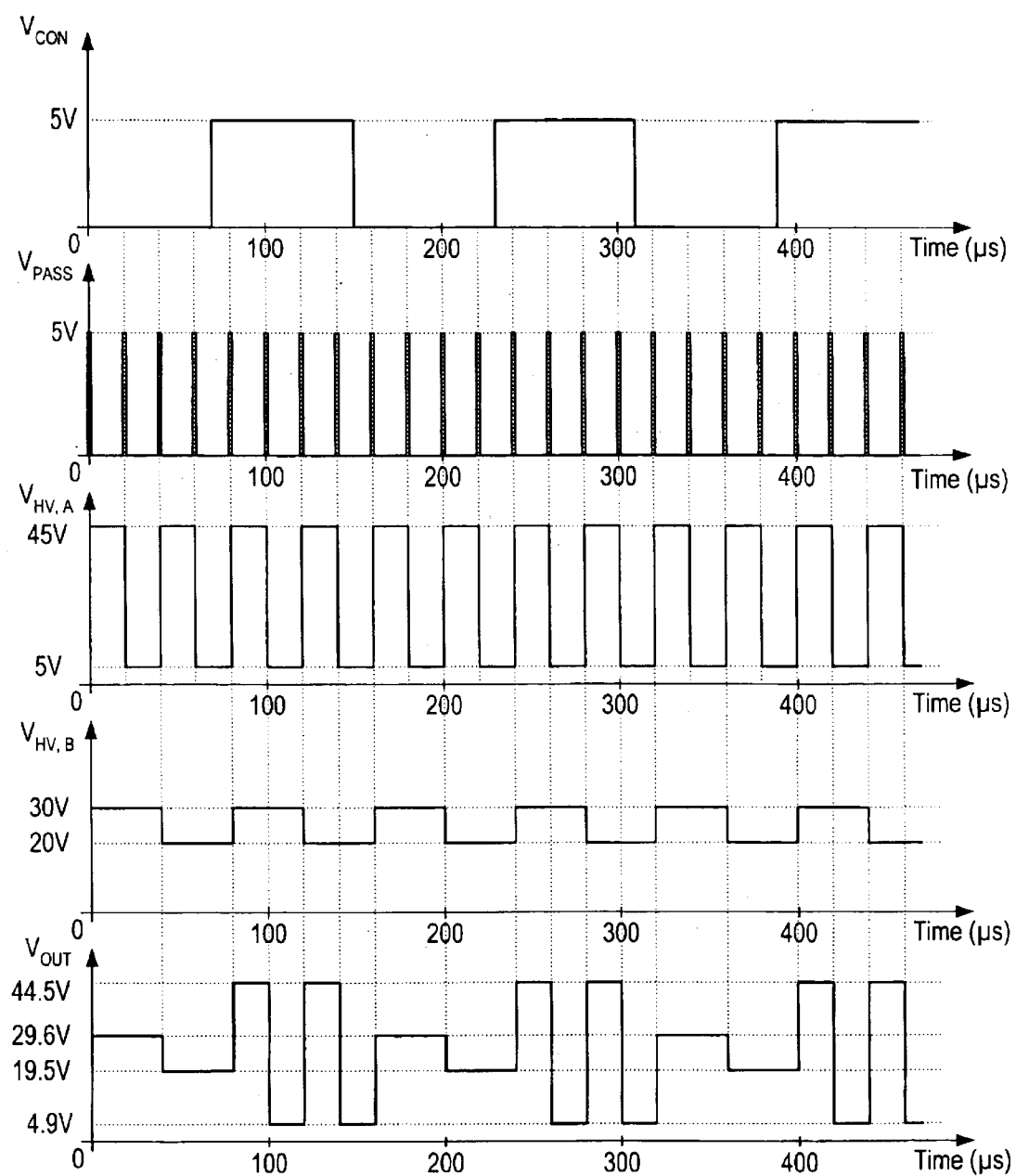
FIG. 20 shows HSPICE simulation results of the circuit of FIG. 18.

In order to determine whether this dynamically controlled analog multiplexer functions satisfactorily, HSPICE simulations were performed with the results shown in FIG. 20. These simulations (carried out on the multiplexer with a capacitive load) indicate that the multiplexer circuit operates as intended. It should be noted that according to the simulation results shown in FIG. 20, the output voltage $V_{OUT}$ is slightly different (maximum 0.5V deviation) from the selected analog input waveform, due to the threshold voltage of the diodes at the output of the circuit. In the simulations there were more strobe pulses used than was strictly necessary for the chosen input data sequence $V_{CON}$. These additional strobe pulses were used since simulations have shown that abrupt changes in the high-voltage waveforms can cause variations in the source-gate voltages of the output PDMOS devices, because of the capacitive coupling between their gate and drain electrodes. Therefore, if the $V_{GS}$ of those transistors is not updated at the moment a sudden change when one of the high-voltage signals occurs, the $V_{GS}$-values could be seriously affected and the multiplexer circuit would not work properly. Therefore, a very simple rule of operation should always be followed. Normally, each time an abrupt change occurs in one or more of the high-voltage signals $V_{HVA}$, $V_{HVB}$ and $V_{OUR}$, an extra strobe pulse $V_{PASS}$ is required to update the $V_{GS}$ of the PDMOS output transistors. To demonstrate that these dynamically controlled analog multiplexers are valuable components for the monolithic integration of cholesteric texture LCD drivers, extensive simulations were carried out on such a driver for a display with three rows and three columns according to a conventional "minimum swing unipolar" driving scheme. This driving scheme is preferred if long-term DC compensation (spread over two consecutive frames) of the cholesteric texture liquid crystal is allowed.

Figure 21:
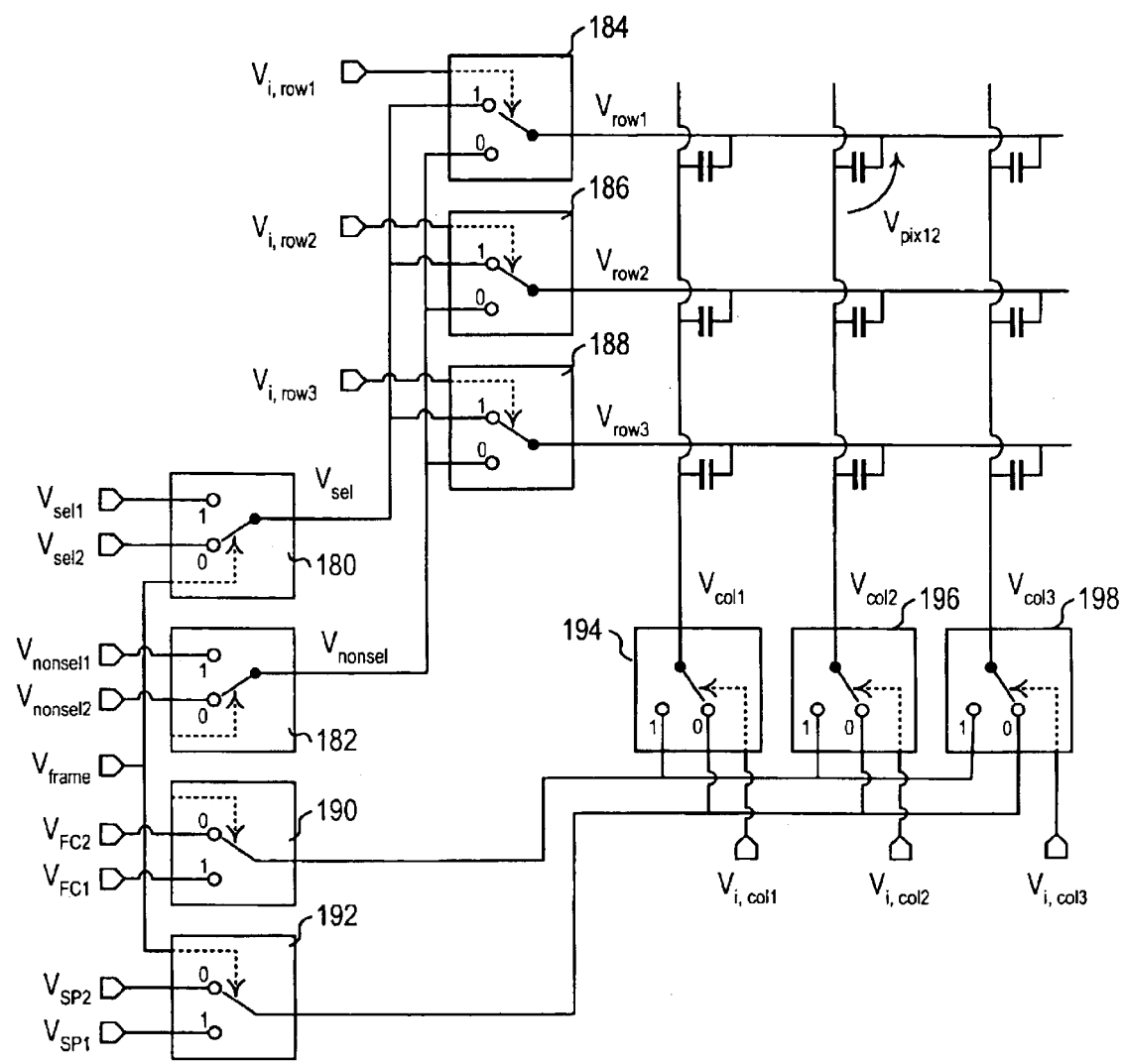
FIG. 21 shows a complex driver architecture incorporating teachings of the present invention.
Figure 22:
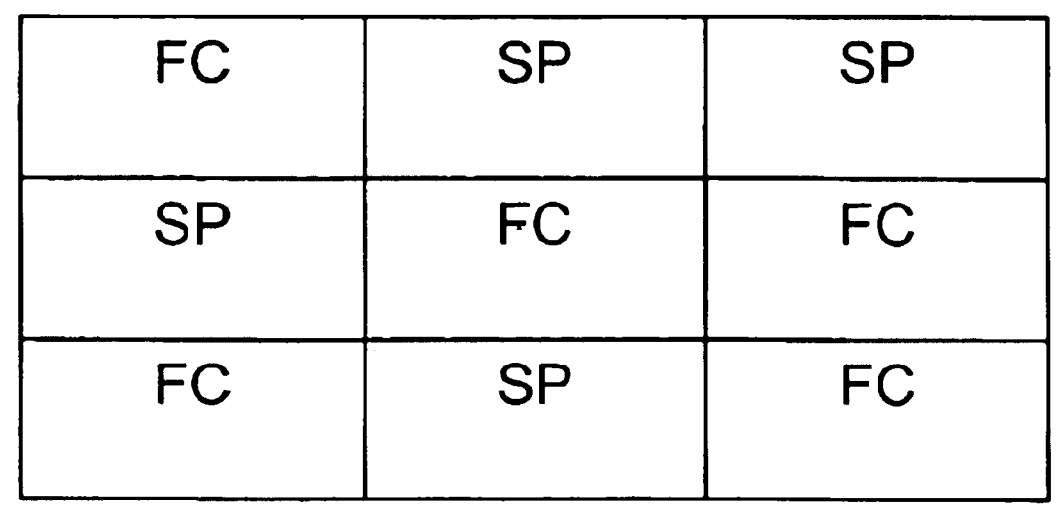
Figure 23A:
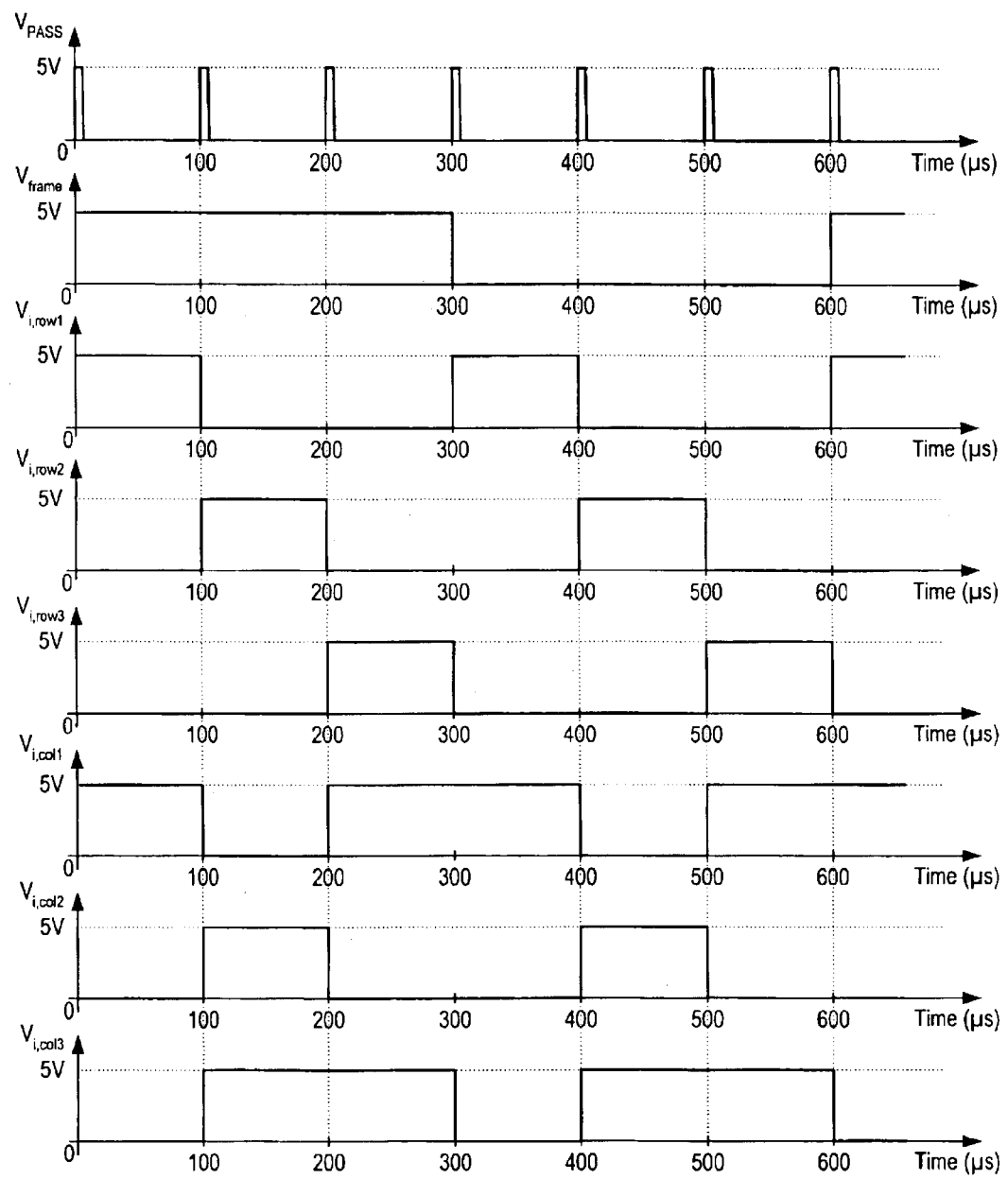
FIGS. 23A through 23C show the HSPICE simulation results of the driver architecture of FIG. 21, and using the display pattern of FIG. 22 using components according to the teachings of the present invention.
Figure 23B:
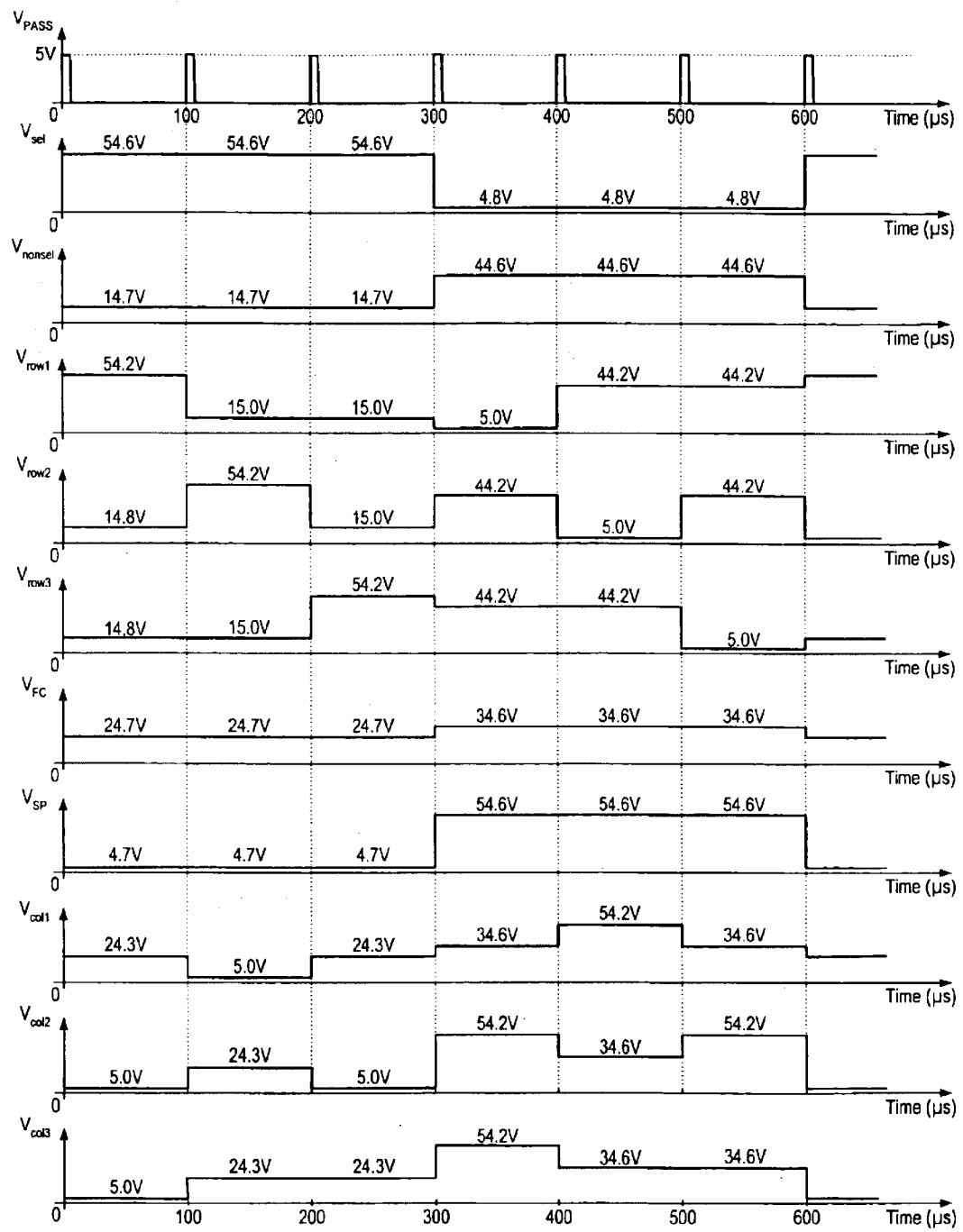
Figure 23C:
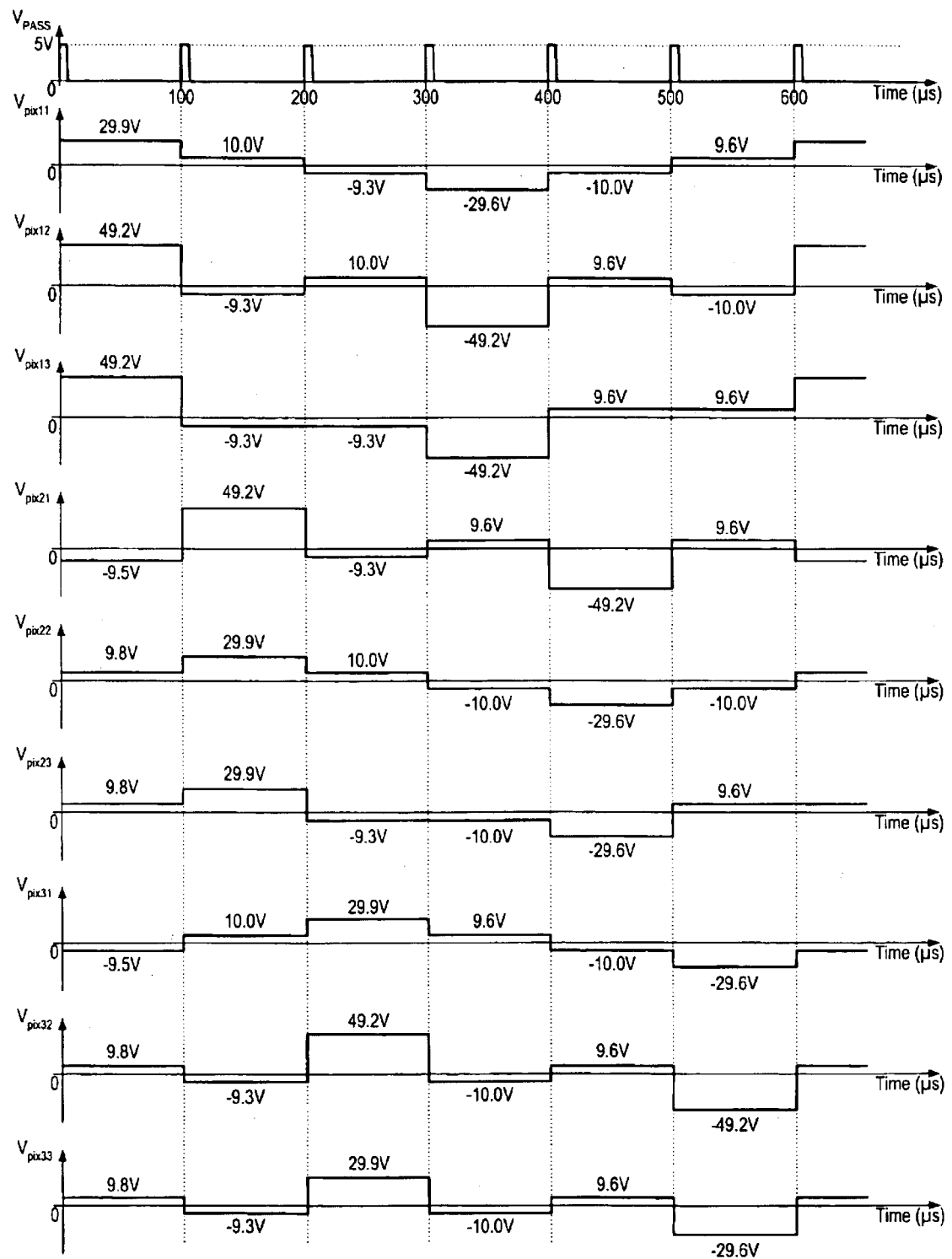

FIG. 21 shows the complete driver architecture. As shown, the row driver consists of five dynamically controlled multiplexers 180, 182, 184, 186 and 188 with two inputs each. A first multiplexer 180 chooses the correct row-select voltage according to the $V_{frame}$ control signal ("1" for the first frame, "0" for the second). A second multiplexer 182 chooses the right row-non-select voltage, also according to the value of the $V_{frame}$ control input. Each one of the other three multiplexers 184, 186 and 188 connects the row-select voltage or the row-non-select voltage to the corresponding row of the LCD. For the column driver, an identical configuration is used, where two multiplexers 190 and 192 are responsible for selecting the appropriate "focal conic" (FC) or "stable planar" (SP) voltages according to $V_{frame}$. The voltages used in the simulations are the following: $V_{sel1}$: row select voltage, frame one: 55V, $V_{sel2}$: row select voltage, frame two: 5V, $V_{FC1}$: row non-select voltage, frame one: 15V, $V_{nonsel2}$: row non-select voltage, frame two: 45V, $V_{FC1}$: column "focal conic" voltage, frame one: 25V, $V_{FC2}$: column "focal conic" voltage, frame two: 35V, $V_{SP1}$: column "stable planar" voltage, frame one: 5V, $V_{SP2}$: column "stable planar" voltage, frame two: 55V. As has been discussed, the gate potentials of the PDMOS output transistors in the multiplexers should be 5V lower than the high-voltage input signals in order to switch the transistors to their conducting state. Therefore, all the high-voltage input signals of the multiplexers should be at any moment at least 5V above the substrate potential which is defined as the 0V reference (ground). The signals $V_{i,row1}$, $V_{i,row2}$, $V_{i,row3}$, $V_{i,col1}$, $V_{i,col2}$ and $V_{i,col3}$ are the 5V CMOS input control signals for the row and column drivers, with a value of "1" (5V) for choosing the row-select and column-"focal conic" voltages, or the value "0" (0V) for choosing the row-select and column-"stable planar" voltages. The strobe signal $V_{PASS}$ is common to all ten dynamically controlled analog multiplexers. The HSPICE-simulations are carried out according to the display pattern of FIG. 22. Using HSPICE, the following waveforms, are simulated: $V_{sel}$: row select voltage, $V_{nonsel}$: row non-select voltage, $V_{row1}$, $V_{row2}$, $V_{row3}$: display row voltages, $V_{FC}$: column "focal conic" voltage, $V_{SP}$: column "stable planar" voltage, $V_{col1}$, $V_{col2}$, $V_{col3}$: display column voltages, $V_{pix,ij}$ (i=1,2,3; j=1,2,3): voltage across the pixel between row i and column j. The simulations of FIGS. 23A, 23B and 23C show that the suggested driver architecture with the dynamically controlled high-voltage analog multiplexers operates very satisfactorily. It should be noted that in the simulations a row addressing time of barely 100 µs was used, while a real cholesteric texture LCD requires row addressing times of at least a few ms in a conventional driving scheme. The 100 µs value was chosen only to reduce the total number of steps in the HSPICE-simulation, resulting in a shorter simulation time, which is considerable because of the large amount of transistors in the circuit. In any event, a row addressing time of e.g. 10 ms would yield exactly the same waveforms. From the simulation results, it is seen that the obtained waveforms are in almost perfect agreement with the theoretically expected waveforms. The maximum deviation between theory and simulation is only 0.8V and is entirely caused by the threshold voltage of the diodes at the output of the multiplexers.

The corresponding structures, materials, acts, and equivalents of all means or step plus function elements in the claims below are intended to include any structure, material, or act for performing the function in combination with other claimed elements as specifically claimed.

We claim:

1. An apparatus for providing an output voltage, comprising:

an output circuit being adapted for outputting an output signal having a first signal range, said output circuit comprising a first part and a second part, each of said first part and second part having an input terminal, wherein each of said first part and said second part of said output circuit is connected at one side to a third voltage level and said first signal range being between the third voltage level and a fourth voltage level; and at least one input circuit, said at least one input circuit being adapted for inputting an input signal having a second signal range and at least a two-level strobe voltage, said input signal comprising at least a two-level input voltage, and second signal range being lower than said first signal range, said at least one input circuit being further adapted for setting a first at least one of said input terminals to a voltage level related to said input voltage when a strobe voltage is set to a first voltage level, and said input circuit being further adapted for electrically isolating a second at least one of said input terminals when said strobe voltage is set to a second voltage level, wherein said second at least one of said input terminals may include said first at least one of said input terminals, said at least one input circuit further comprises:

a switch, said switch having a first end connected to said third voltage level and a second end connected to a third at least one of said input terminals and said switch being adapted for setting said third at least one of said input terminals to said third voltage when the switch is active; and a one-way conducting element, said one-way conducting element connected to said third at least one of said input terminals and to said second end of said switch and said one-way conducting element being adapted for setting said third at least one of said input terminals to a voltage level lower than said third voltage level when said switch is inactive, wherein said third at least one of said input terminals may include one of said first at least one of said input terminals and said second at least one of said input terminals.

2. The apparatus as recited in claim 1 further comprises:
a cholesteric liquid crystal display; and
a driving circuit, said driving circuit for driving said cholesteric liquid crystal display, wherein said driving circuit includes said output circuit and further includes said at one input circuit.

* * * * *